(12) United States Patent
Tsubamoto et al.

(10) Patent No.: US 8,243,995 B2
(45) Date of Patent: Aug. 14, 2012

(54) APPARATUS AND METHOD FOR EYE MARGIN CALCULATING, AND COMPUTER-READABLE RECORDING MEDIUM RECORDING PROGRAM THEREFOF

(75) Inventors: Daita Tsubamoto, Kawasaki (JP); Masaki Tosaka, Kawasaki (JP); Shogo Fujimori, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 344 days.

(21) Appl. No.: 12/591,843

(22) Filed: Dec. 2, 2009

(65) Prior Publication Data
US 2010/0080421 A1  Apr. 1, 2010

Related U.S. Application Data

(63) Continuation of application No. PCT/JP2008/059879, filed on May 29, 2008.

(30) Foreign Application Priority Data

Jun. 5, 2007  (WO) .................. PCT/JP2007/061343

(51) Int. Cl.
*G06K 9/00* (2006.01)

(52) U.S. Cl. ............ 382/106; 382/100; 702/57; 702/66; 702/69

(58) Field of Classification Search .................. 382/100, 382/106; 702/57, 66, 69
See application file for complete search history.

(56) References Cited

U.S. PATENT DOCUMENTS

| | | | |
|---|---|---|---|
| 5,491,722 A * | 2/1996 | Jones et al. .................. 375/224 |
| 6,278,755 B1 | 8/2001 | Baba et al. |
| 6,430,715 B1 * | 8/2002 | Myers et al. .................. 714/704 |
| 6,925,430 B2 * | 8/2005 | Suwada et al. .................. 703/15 |
| 2003/0007222 A1 | 1/2003 | Kwasaki et al. |
| 2006/0062234 A1 | 3/2006 | Tsubamoto |

FOREIGN PATENT DOCUMENTS

JP  01-160237  6/1989
(Continued)

OTHER PUBLICATIONS

International Preliminary Report on Patentability mailed Dec. 17, 2009 in corresponding International Patent Application PCT/JP2008/059879.

(Continued)

*Primary Examiner* — Andrew W Johns
*Assistant Examiner* — Shefali Goradia
(74) *Attorney, Agent, or Firm* — Staas & Halsey LLP

(57) ABSTRACT

A center location of an eye pattern generated by superimposing waveform signal pieces cut out from a waveform signal generated by a simulator is calculated, and an arrangement of a mask as a quality evaluation criterion of the eye pattern on the center location is envisaged to calculate time coordinate values and voltage coordinate values of feature points included in the mask. First feature points not on a time axis is set as processing objects, and a margin in the voltage axis direction is calculated based on the voltage coordinate values of the first feature points and the voltage coordinate values of waveform signal piece parts associated with the first feature points. Second feature points on the time axis is set as processing objects, and a margin in the time axis direction is calculated based on the time coordinate values of the second feature points and the time coordinate values of waveform signal piece parts associated with the second feature points.

10 Claims, 32 Drawing Sheets

FOREIGN PATENT DOCUMENTS

| | | |
|---|---|---|
| JP | 06-237231 | 8/1994 |
| JP | 2000-332736 | 11/2000 |
| JP | 2001-144819 | 5/2001 |
| JP | 2003-018140 | 1/2003 |
| JP | 2004-357050 | 12/2004 |
| JP | 2006-090788 | 4/2006 |

OTHER PUBLICATIONS

International Preliminary Report on Patentability mailed Dec. 17, 2009 in related International Patent Application PCT/JP2007/061343.

English Translation of the International Preliminary Report on Patentability mailed Dec. 17, 2009 in related International Patent Application PCT/JP2007/061343.

Japanese Office Action dated Jun. 29, 2010 and issued in corresponding Japanese Patent Application 2009-517819.

International Search Report for PCT/JP2008/059879, mailed Jul. 1, 2008.

* cited by examiner

PASSAGE OF TIME

APPARATUS AND METHOD FOR EYE MARGIN CALCULATING, AND COMPUTER-READABLE RECORDING MEDIUM RECORDING PROGRAM THEREFOF

CROSS-REFERENCE TO RELATED APPLICATIONS

This is a continuation application, filed under 35 U.S.C. §111(a), of international application No. PCT/JP2008/059879, filed on May 29, 2008, which claimed priority to international application No. PCT/JP2007/061343, filed Jun. 5, 2007, the disclosures of which are incorporated herein by reference.

FIELD

The embodiments discussed herein are related to an eye margin calculating apparatus, a eye margin calculating method, and a computer-readable recording medium recording a program for calculating an eye margin.

BACKGROUND

In recent years, an amount of information processing required for a digital electronic device is continuously increasing, and accordingly, the signal speed in the digital electronic device is speeded up. Consequently, many simulations performed in the product design phase correspond to high-speed signals.

One of the functions of a simulator that performs such a simulation includes a function of displaying a signal waveform analysis result in an eye pattern. And, it is needed to construct a technique for quantitative evaluation of the eye pattern.

A simulator generates an eye pattern by superimposing waveform signal pieces in a specified length that are sequentially cut out from waveform signals generated by the simulator. For example, a pattern shape as illustrated in FIG. 18 is expressed when waveform signal pieces with a length of two clock cycles are sequentially cut out and superimposed.

A maker that provides a receiving device presents a mask in a shape as illustrated for example in FIG. 19A to 19C as a specification of the receiving device. And then, the maker requests that the mask falls within the opening of the eye pattern when the receiving device is used.

As illustrated in FIG. 19A, the shape of the mask illustrated in FIG. 19A to 19C can be specified by designating α (time value), β (time value), and γ (voltage value). As a result, the center location of the mask is designated as illustrated in FIG. 19B. And, mask locations (time coordinate values and voltage coordinate values) of feature points such as point r, point s, point t, point u, point p, and point q included in the mask are designated as illustrated in FIG. 19C.

When the mask is presented, the designer of the maker who uses the receiving device generates waveform signals to be received by the receiving device by the simulator. And, the designer sequentially cuts out waveform signal pieces with a specified length from the waveform signals, and superimposes the waveform signal pieces to generate an eye pattern, in the design phase. And then, the designer checks whether the mask falls within an opening of the generated eye pattern, and, when the mask does not fall within the opening, changes the design of the operating frequency, transmission path, and the like so that the mask falls within the opening.

To perform the check, conventionally, the generated eye pattern is displayed on a display, and the mask relative to the eye pattern is displayed on the display in a format that the mask can move in the time axis direction. The designer moves the mask to a time location where the margin is expected to be the largest, and at the time location, visually measures a margin (margin included in the eye pattern relative to the mask) defined by a distance between the eye pattern and the mask.

However, when such a conventional technique is followed, the user as a designer needs to adjust the location of the mask. Therefore, there is a problem that a great burden is imposed on the user, and there is a problem that variations in margin measurements are large due to differences in the users.

Under the circumstances, one of us proposed a technique in Patent Document 1 listed below. The technique is as follow. A plot inside an eye pattern is created to allow automatic measurement of a margin relative to a mask. And, the mask is moved in a certain direction of the time axis by arbitrary steps to obtain the margin in each destination. A mask location immediately before a difference value of margin relative to adjacent destinations turns from positive to negative is determined to be optimal, and the margin at that point is determined as a final margin.

Patent Document 2 listed below describes a technique concerning a transmitting apparatus that automatically measures a discrimination point with the least occurrence of error in an effective area of an eye pattern and treats the discrimination point as an optimal point to control the reproduction.

Patent Document 3 listed below describes a technique concerning a bit synchronizing circuit that extracts a center phase of an eye opening part without depending on the jitter distribution of input data to secure an optimal retiming margin.

Patent Document 1 Japanese Laid-Open Patent Publication No. 2006-90788
Patent Document 2 Japanese Laid-Open Patent Publication No. 2003-18140
Patent Document 3 Japanese Laid-Open Patent Publication No. 2000-332736

In the conventional techniques, to measure a margin between an eye pattern generated by a simulator and a mask, the generated eye pattern is displayed on a display, and the mask relative to the eye pattern is displayed on the display in a format that the mask can be moved in the time axis direction. The designer moves the mask to a time location where the margin is expected to be the largest, and at the time location, visually measures a margin between the eye pattern and the mask.

However, when such conventional techniques are followed, the user as a designer needs to adjust the location of the mask. Therefore, there is a problem that a great burden is imposed on the user, and there is a problem that variations in margin measurements are large due to differences in the users.

Under the circumstances, one of us disclosed the technique in Patent Document 1. That is, the plot inside an eye pattern is created to allow automatic measurement of the margin relative to a mask. And, the mask is moved in the certain direction of the time axis by arbitrary steps to obtain the margin in each destination. The mask location immediately before the difference value of margin relative to adjacent destinations turns from positive to negative is determined to be optimal, and the margin at that time is determined as the final margin.

However, the optimal mask location obtained in the invention may not be a mask location required when the receiving device actually operates. Therefore, there is a problem that it cannot be stated that the margin obtained in the invention always indicates an accurate margin.

The techniques described in Patent Documents 2 and 3 are techniques made to improve an actual operating state of the receiving device and are not inventions for realizing an automatic evaluation of the size of the opening of the eye pattern generated by the simulator.

SUMMARY

According to an aspect of the embodiment, an eye margin calculating apparatus that calculates a margin between an eye pattern generated by superimposing waveform signal pieces with a specified length cut out from a waveform signal generated by a simulator and a mask indicating the size of an opening required for the eye pattern. The eye margin calculating apparatus includes first calculating means for calculating a center location of the eye pattern; second calculating means for calculating time coordinate values and voltage coordinate values of feature points included in the mask in a case that a center location of the mask is arranged at the center location of the eye pattern; third calculating means for calculating a margin in a voltage axis direction based on voltage coordinate values of first feature points and voltage coordinate values of waveform signal piece parts associated with the first feature points, the first feature points being feature points not on a time axis among the feature points; and fourth calculating means for calculating a margin in a time axis direction based on time coordinate values of second feature points and time coordinate values of waveform signal piece parts associated with the second feature points, the second feature points being feature points on the time axis among the feature points.

As described, according to the embodiment, a margin included in an eye pattern, which is generated by a simulator implemented in a product design phase of an electronic device, relative to a mask serving as a quality evaluation criterion can be automatically calculated.

According to the embodiment, the characteristics of the clock data recovery incorporated into the receiving device are taken into consideration in the automatic calculation of the margin, and the mask as a quality evaluation criterion is arranged at the center location on the time axis of the eye pattern opening to calculate the margin. As a result, an accurate margin required in the actual operation of the receiving device can be calculated.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
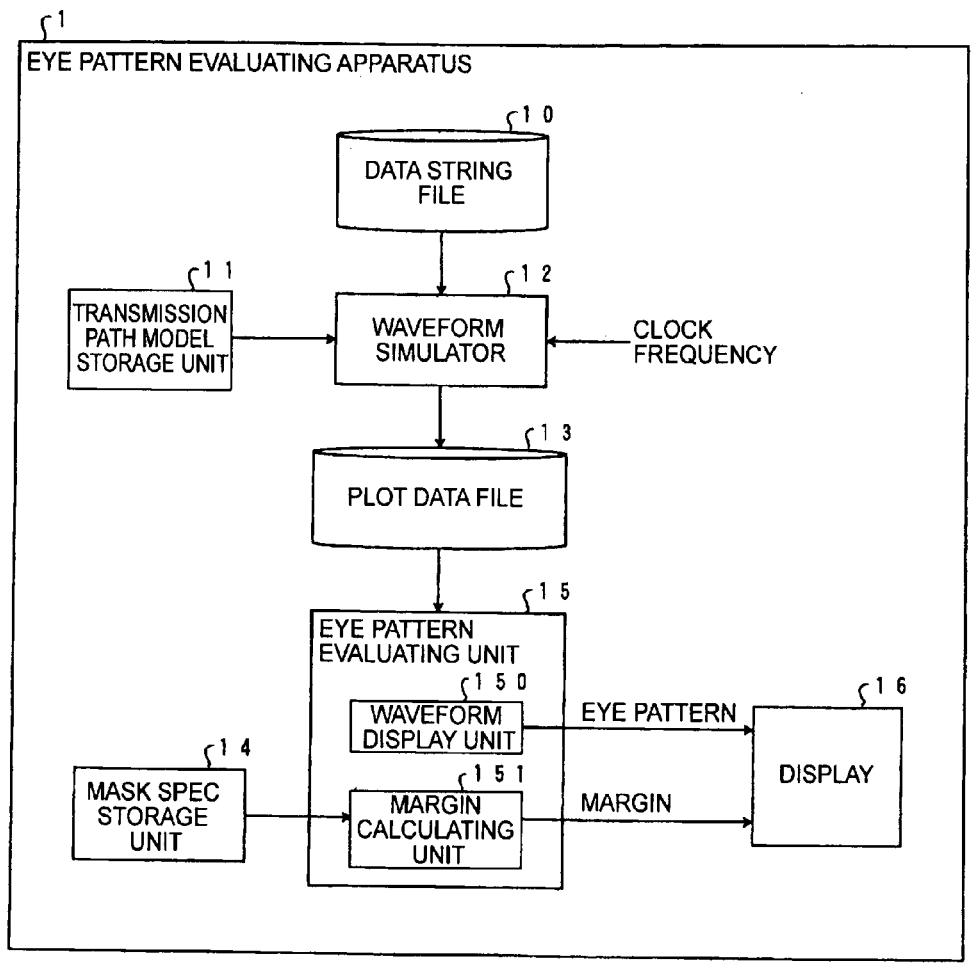
FIG. 1 is a diagram of an eye pattern evaluating apparatus of an embodiment.

An eye margin calculating apparatus of the present embodiment realizes automatic calculation of a margin between an eye pattern, which is generated by superimposing waveform signal pieces with a specified length cut out from a waveform signal generated by a simulator, and a mask, which indicates a size of an opening required for the eye pattern. The eye margin calculating apparatus of the present embodiment may include (1) first calculating means for calculating a center location of the eye pattern, (2) second calculating means for calculating time coordinate values and voltage coordinate values of feature points included in the mask in a case that a center location of the mask is arranged at the center location of the eye pattern calculated by the first calculating means, (3) third calculating means for calculating a margin in a voltage axis direction based on voltage coordinate values of first feature points and voltage coordinate values of waveform signal piece parts associated with the first feature points, the first feature points being feature points not on a time axis among the feature points, and (4) fourth calculating means for calculating a margin in a time axis direction based on time coordinate values of second feature points and time coordinate values of waveform signal piece parts associated with the second feature points, the second feature points being feature points on the time axis among the feature points.

In the above structure, the first calculating means may extract waveform signal parts near the time axis included in the waveform signal pieces, detect minimum times and maximum times included in time coordinate values of the extracted waveform signal parts, and calculate the center location of the eye pattern based on the detected minimum times and maximum times.

The third calculating means may use voltage coordinate values of the waveform signal piece parts each of which has a time coordinate value closest to each of the first feature points, as the voltage coordinate values of the waveform signal piece parts associated with the first feature points. Further, the third calculating means may use voltage coordinate values each of which is obtained by linearly interpolating two waveform signal piece parts that sandwich and are adjacent to each of the first feature points, as the voltage coordinate values of the waveform signal piece parts associated with the first feature points.

The fourth calculating means may use time coordinate values of the waveform signal piece parts each of which has a voltage coordinate value near the time axis and is closest to the time axis, as the time coordinate values of the waveform signal piece parts associated with the second feature points. Further, the fourth calculating means may use coordinate values on the time axis each of which is obtained by linearly interpolating two waveform signal piece parts that sandwich and are adjacent to the time axis, as the time coordinate values of the waveform signal piece parts associated with the second feature points.

The third calculating means may calculate a difference between the voltage coordinate values of the first feature points and the voltage coordinate values of the waveform signal piece parts associated with the first feature points for each of the waveform signal pieces, specify a smallest difference value among the difference values to calculate margins in the voltage axis direction of each of the first feature points, and select a smallest margin among the margins as a final margin in the voltage axis direction.

The fourth calculating means may calculate a difference between the time coordinate values of the second feature points and the time coordinate values of the waveform signal piece parts associated with the second feature points for each of the waveform signal pieces, specify a smallest difference value among the difference values to calculate margins in the time axis direction of each of the second feature points, and select a smallest margin among the margins as a final margin in the time axis direction.

The processing means described above can be realized by a computer program. The computer program is provided by a computer-readable recording medium or through a network, and is installed to be operated on control means such as a CPU, when each embodiment is implemented.

The eye margin calculating apparatus of the embodiments sequentially cuts out waveform signal pieces with a specified length from waveform signals generated by a simulator, and superimposed the waveform signal pieces, to generate an eye pattern. After that, the eye margin calculating apparatus first extracts waveform signal parts near the time axis included in the waveform signal pieces, detects the minimum times and the maximum times included in the time coordinate values of the extracted waveform signal parts. Then, the eye margin calculating apparatus obtains the middle location between the detected minimum times and maximum times as the center location of the eye pattern.

A circuit for optimizing data extraction timing called clock data recovery (hereinafter, may be abbreviated "CDR") is incorporated into the receiving device that controls high-speed data communications. Due to the characteristics of the CDR, the mask as a criterion needs to be arranged at the center location on the time axis of the eye pattern opening.

Therefore, the center location on the time axis of the eye pattern opening is first found out to calculate the center location of the eye pattern.

Subsequently, a condition that the center location of the mask is arranged at the center location of the calculated eye pattern is adopted to calculate the time coordinate values and the voltage coordinate values of the feature points included in the mask under the arrangement.

Figure 19A:
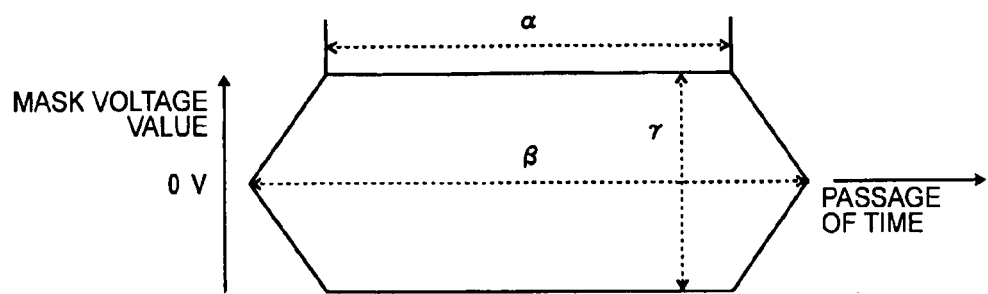
FIGS. 19A, 19B and 19C are explanatory views of masks.
Figure 19B:
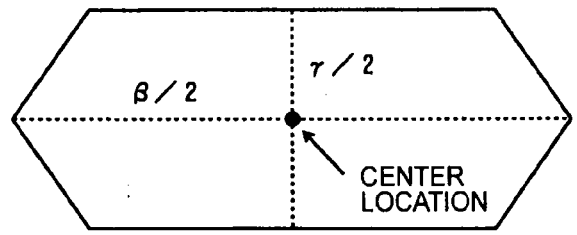
Figure 19C:
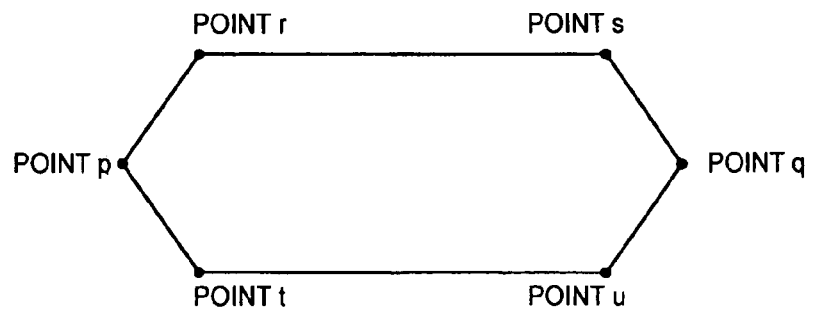

For example, when a maker that provides the receiving device presents a mask as illustrated in FIG. 19, the condition is adopted that the center location of the mask is arranged at the location calculated as the center location of the eye pattern. And, the time coordinate values and the voltage coordinate values of feature points point r, point s, point t, point u, point p, and point q included in the mask are calculated under the arrangement.

Subsequently, a feature point not on the time axis among the feature points included in the mask is set as a processing object, and based on the voltage coordinate value of the feature point to be processed and the voltage coordinate value of the waveform signal piece part associated with the feature point, the margin in the voltage axis direction of the feature point to be processed is calculated. The margins are calculated as margins in the voltage axis direction. Alternatively, the smallest margin among the margins is specified and calculated as a margin in the voltage axis direction.

For example, the voltage coordinate value of the waveform signal piece part in which the time coordinate value is closest to the feature point to be processed is used as the voltage coordinate value of the waveform signal piece part associated with the feature point to be processed. The minimum distance between the voltage coordinate value and the voltage coordinate value of the feature point to be processed is obtained to calculate the margins in the voltage axis direction of the feature point to be processed. The margins are calculated as margins in the voltage axis direction. Alternatively, the minimum margin among the margins is specified and calculated as a margin in the voltage axis direction.

Furthermore, for example, the voltage coordinate value on the time coordinate value of the feature point to be processed obtained by linearly interpolating two waveform signal piece parts that sandwich the feature point to be processed and that are adjacent to the feature point to be processed is used as the voltage coordinate value of the waveform signal piece part associated with the feature point to be processed. The minimum distance between the voltage coordinate value and the voltage coordinate value of the feature point to be processed is obtained to calculate the margins in the voltage axis direction of the feature point to be processed. The margins are calculated as margins in the voltage axis direction. Alternatively, the minimum margin among the margins is specified and calculated as a margin in the voltage axis direction.

Subsequently, a feature point on the time axis among the feature points included in the mask is set as a processing object. Based on the time coordinate value of the feature point to be processed and the time coordinate value of the waveform signal piece part associated with the feature point, the margins in the time axis direction of the feature point to be processed is calculated. The margins are calculated as margins in the time axis direction. Alternatively, the smallest margin among the margins is specified and calculated as a margin in the time axis direction.

For example, the time coordinate value of the waveform signal piece part in which the voltage coordinate value is near the time axis and closest to the time axis is used as the time coordinate value of the waveform signal piece part associated with the feature point to be processed. The minimum distance between the time coordinate value and the time coordinate value of the feature point to be processed is obtained to calculate the margins in the time axis direction of the feature point to be processed. The margins are calculated as margins in the time axis direction. Alternatively, the minimum margin among the margins is specified and calculated as a margin in the time axis direction.

Furthermore, for example, the coordinate value on the time axis obtained by linearly interpolating two waveform signal piece parts that sandwich the time axis and that are adjacent to the time axis is used as the time coordinate value of the waveform signal piece part associated with the feature point to be processed. The minimum distance between the time coordinate value and the time coordinate value of the feature point to be processed is obtained to calculate the margins in the time axis direction of the feature point to be processed. The margins are calculated as margins in the time axis direction. Alternatively, the minimum margin among the margins is specified and calculated as a margin in the time axis direction.

Preferred embodiments of the present invention will be explained with reference to accompanying drawings.

FIG. 1 illustrates a diagram of an eye pattern evaluating apparatus 1 of an embodiment.

The eye pattern evaluating apparatus 1 of the present embodiment includes a data string file 10, a transmission path model storage unit 11, a waveform simulator 12, a plot data file 13, a mask spec storage unit 14, an eye pattern evaluating unit 15, and a display 16.

Figure 2:
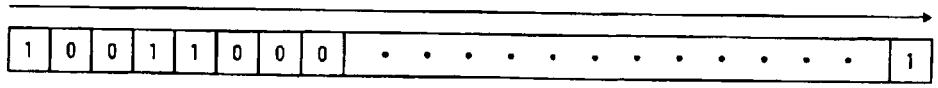
FIG. 2 is an explanatory view of a data string storing a data string file.

The data string file 10 stores a data string constituted by time-series data of a signal constituted by 1 or 0 as illustrated in FIG. 2.

The transmission path model storage unit 11 stores a mathematical model of a transmission path connected to a receiving device included in an apparatus to be designed.

The waveform simulator 12 simulates a transmission waveform of the data string stored in the data string file 10 based on the transmission path model stored in the transmission path model storage unit 11 to generate plot data describing a correspondence relationship between time and waveform voltage value.

Figure 3:
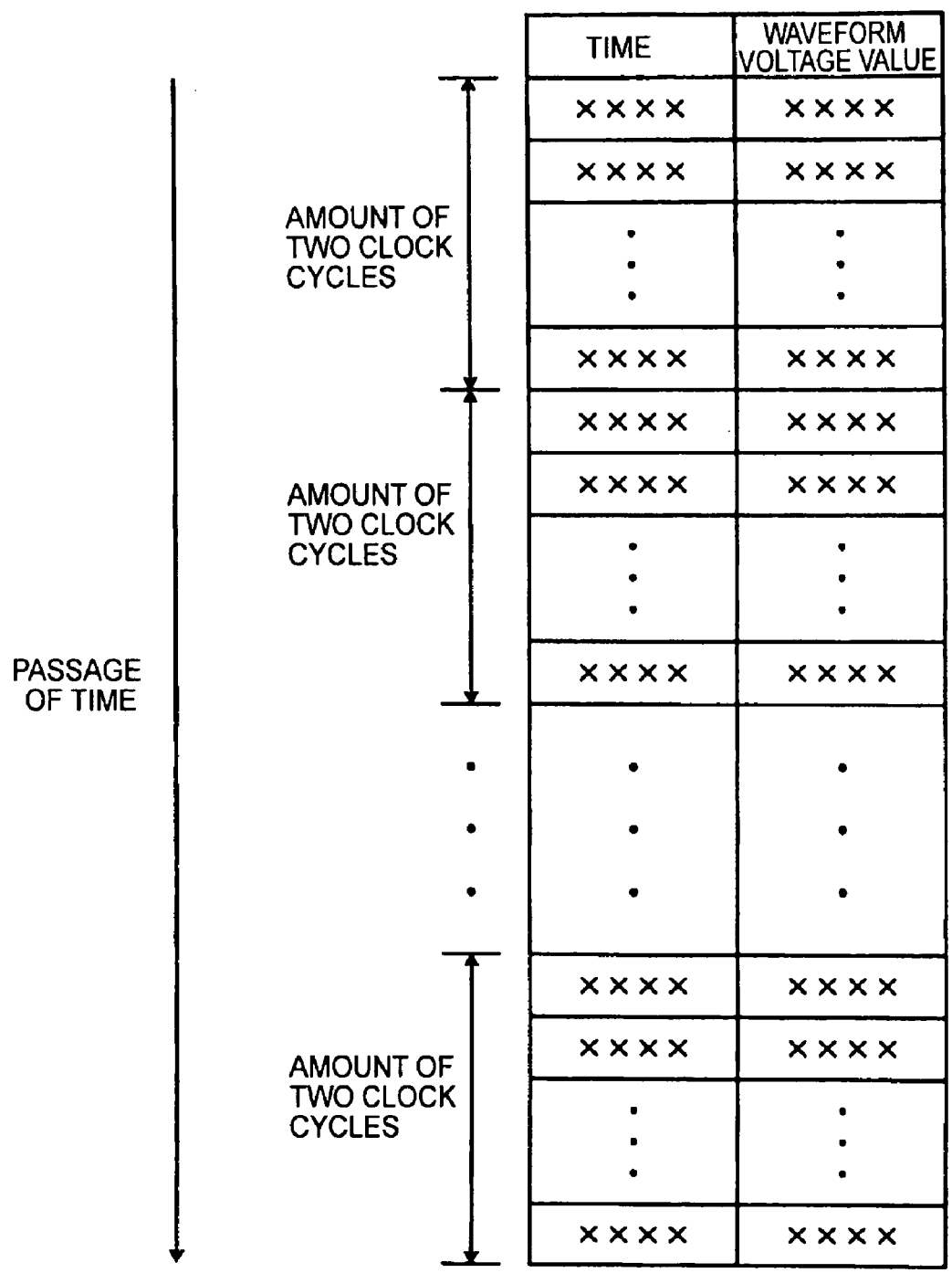
FIG. 3 is an explanatory view of plot data storing a plot data file.

The plot data file 13 stores plot data as illustrated in FIG. 3 generated by the waveform simulator 12.

The mask spec storage unit 14 stores a spec of a mask as illustrated in FIG. 19 serving as a quality evaluation criterion of an eye pattern.

Figure 18:
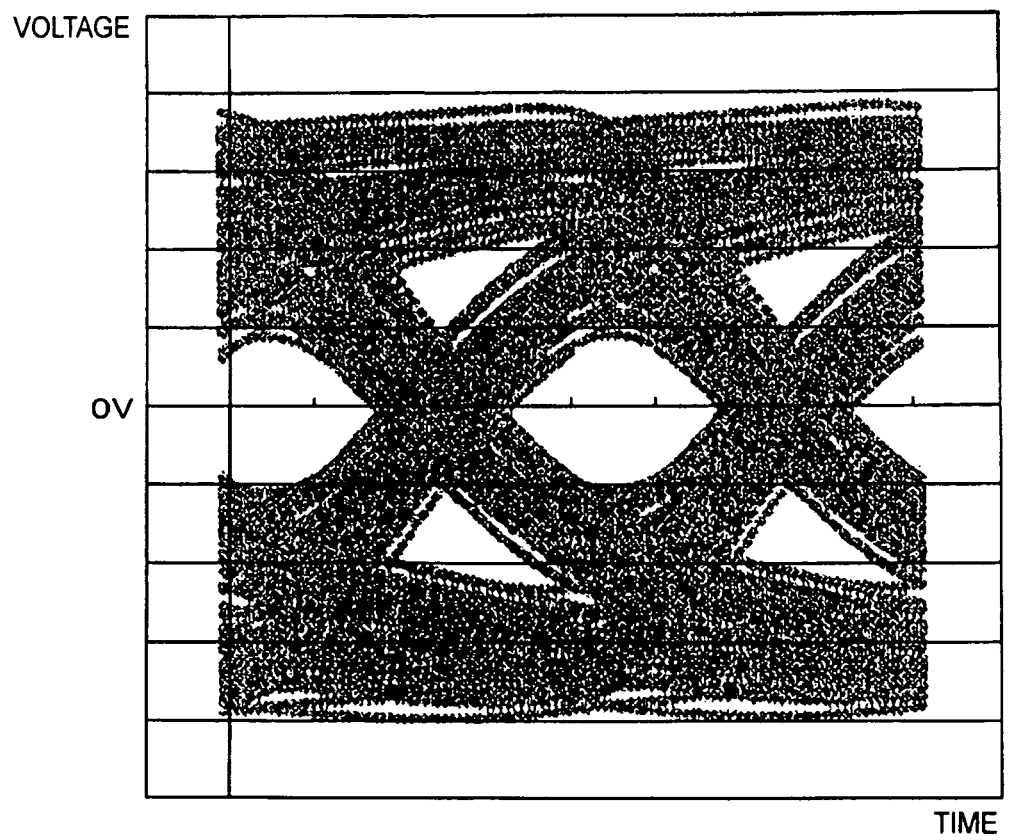
FIG. 18 is an explanatory view of an eye pattern.

The eye pattern evaluating unit 15 includes a waveform display unit 150 and a margin calculating unit 151. The waveform display unit 150 sequentially cuts out waveform signal pieces with a length of two clock cycles from plot data stored in the plot data file 13, and superimposes and displays the waveform signal pieces on the display 16. In other words, the waveform display unit 150 generates an eye pattern as illustrated in FIG. 18, and display the eye pattern on the display 16. The margin calculating unit 151 calculates a margin included in an eye pattern, which is generated by the waveform display unit 150, relative to a mask stored in the mask spec storage unit 14, and displays the calculation result of the margin on the display 16. As a result, the eye pattern evaluating unit 15 generates an eye pattern, displays the eye pattern on the display 16, calculates a margin included in the eye pattern relative to the mask, and displays the calculation result of the margin on the display 16.

FIGS. 4 to 8 illustrate examples of flow charts executed by the eye pattern evaluating unit 15.

Figure 4:
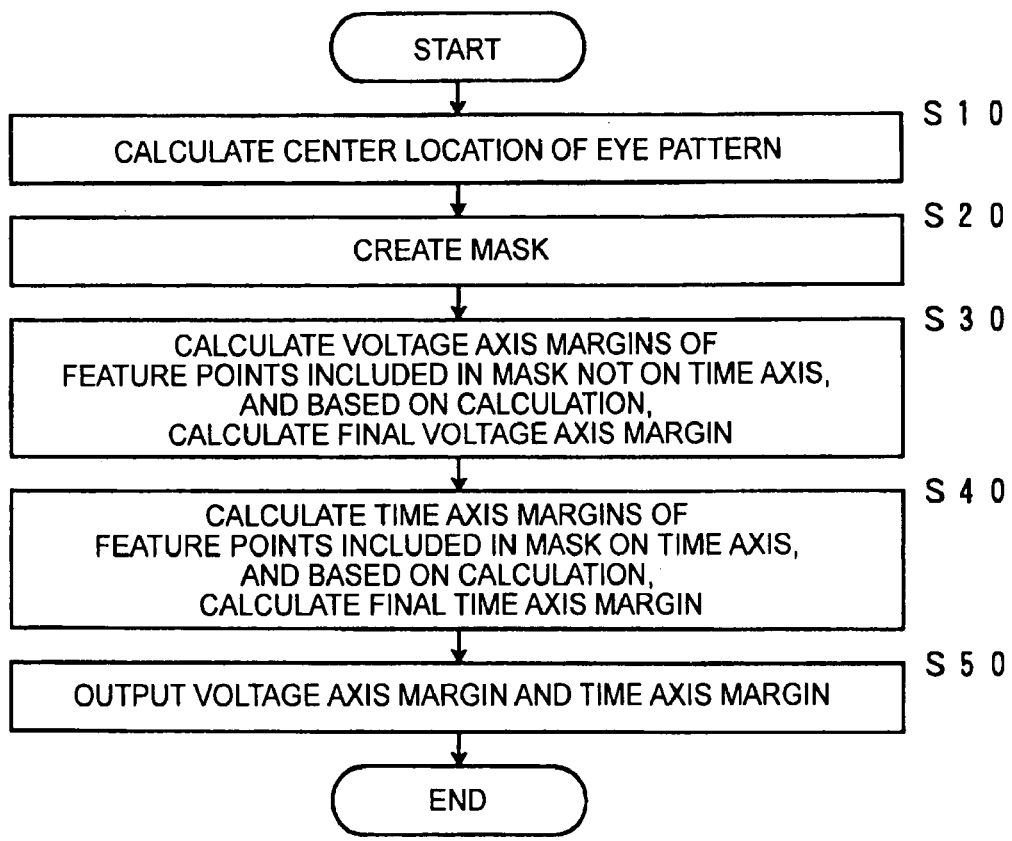
FIGS. 4 to 8 are examples of flow charts executed by an eye pattern evaluating unit.
Figure 5:
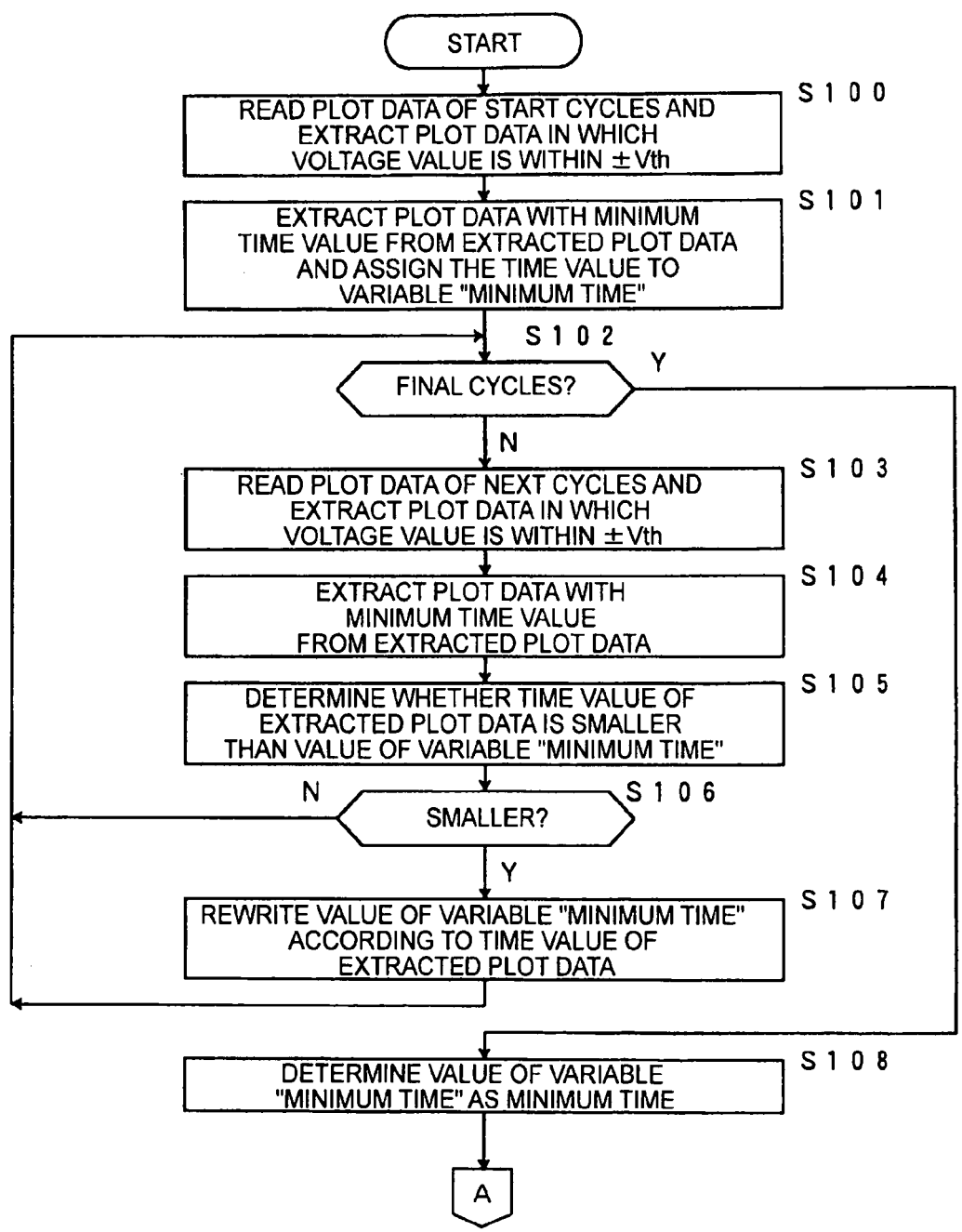
Figure 6:
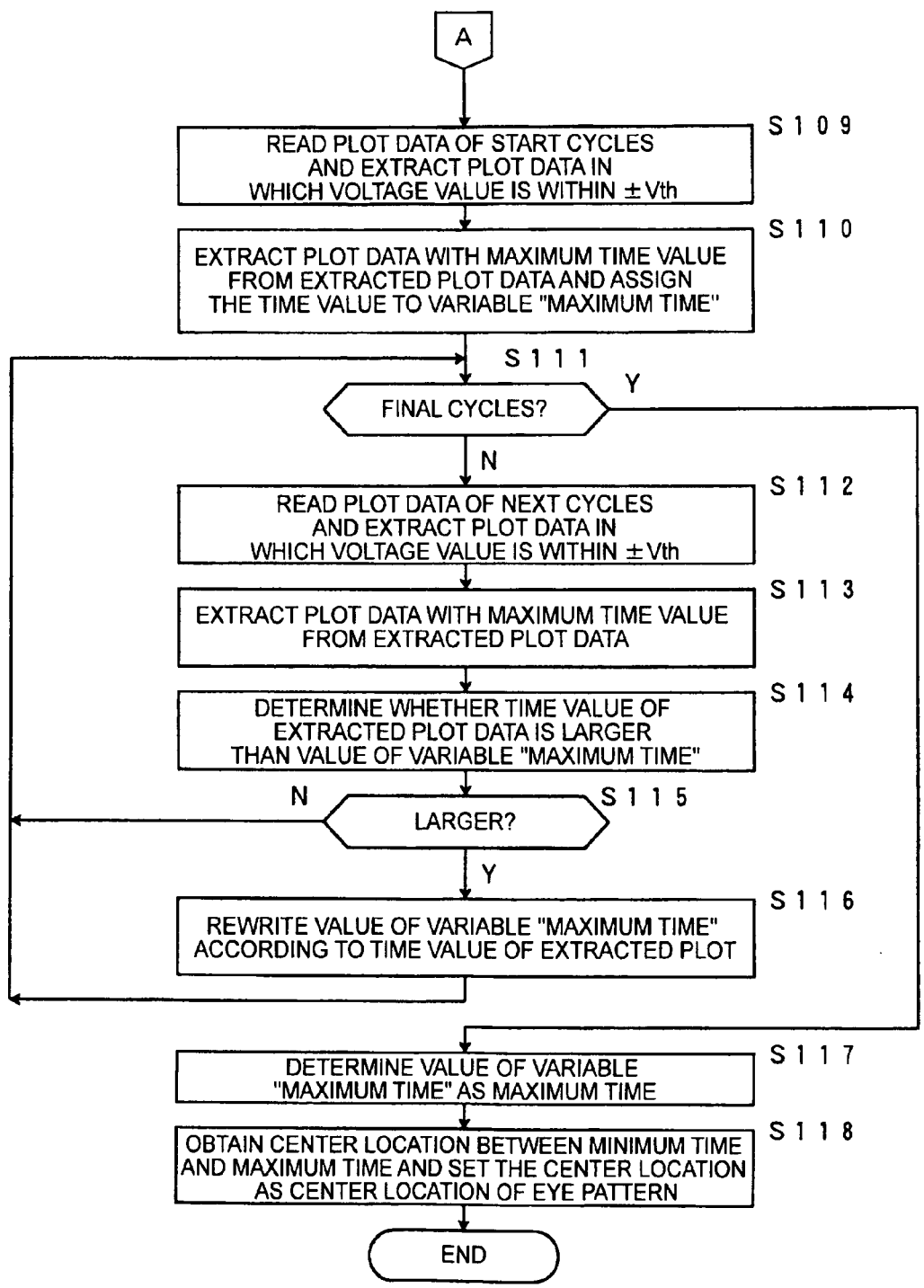
Figure 7:
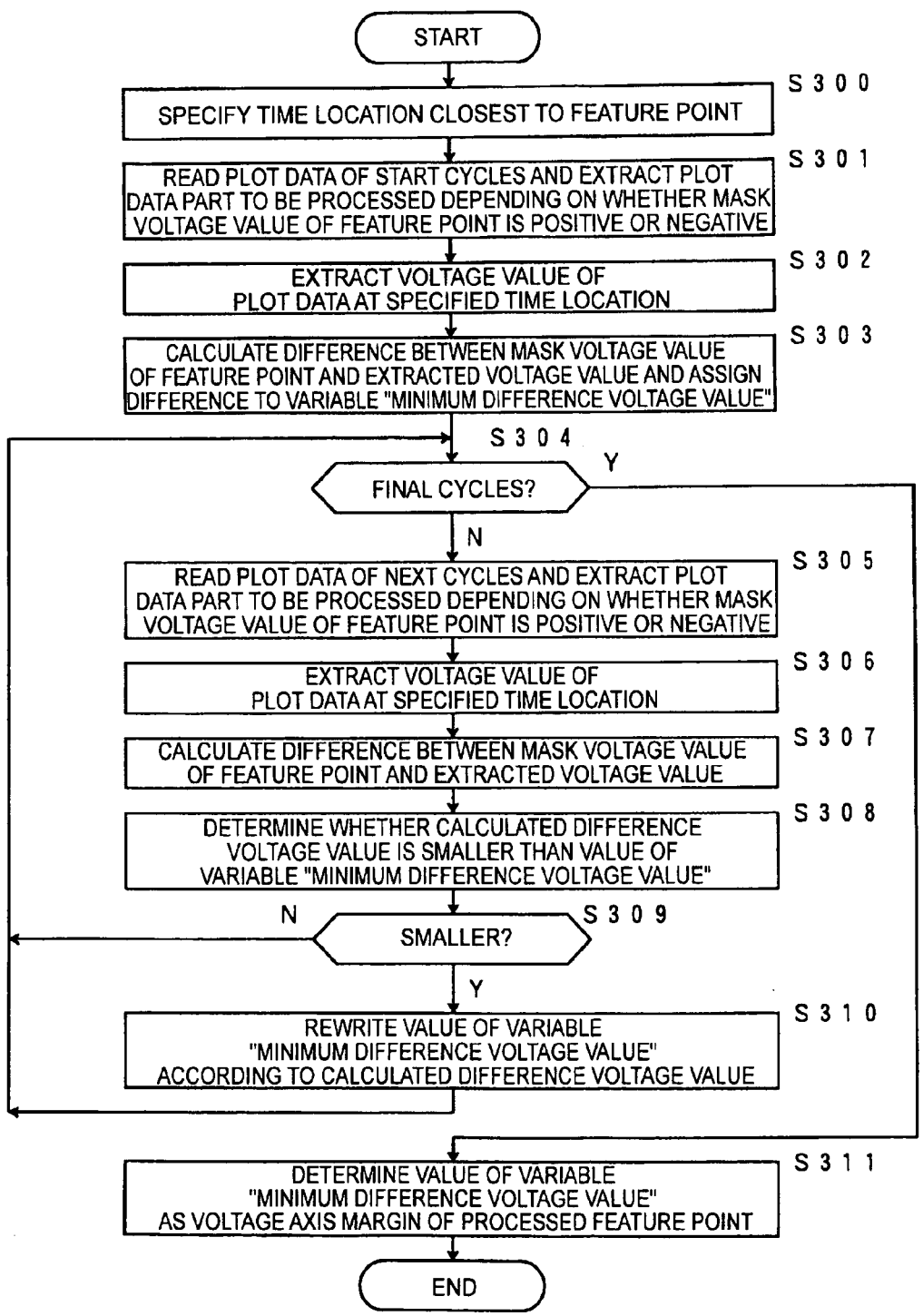
Figure 8:
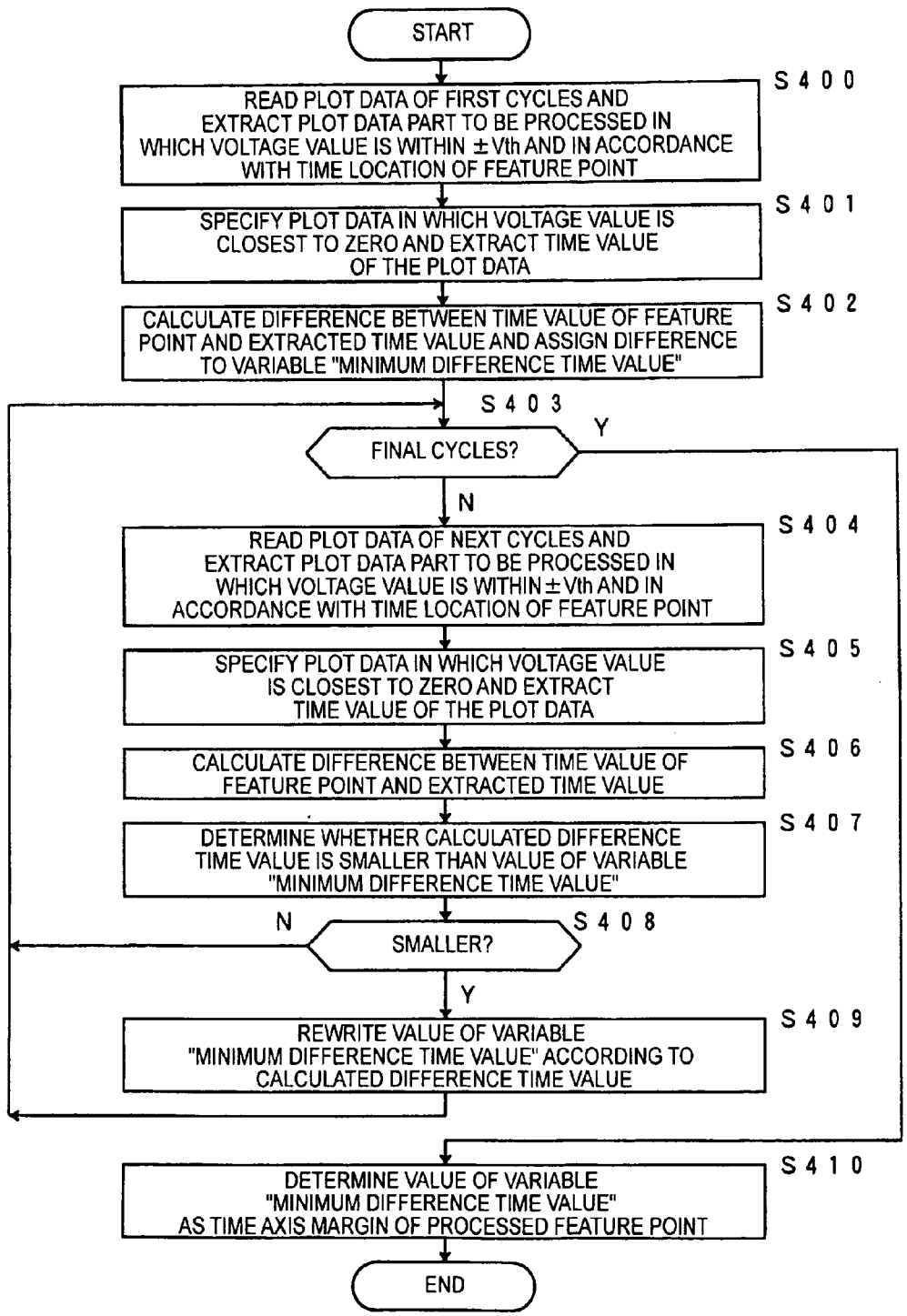

The flow chart illustrated in FIG. 4 is a flow chart of the entire processing executed by the eye pattern evaluating unit 15. A combination of the flow charts illustrated in FIGS. 5 and 6 is a detailed flow chart of a processing executed in step S10 of the flow chart illustrated in FIG. 4. The flow chart illustrated in FIG. 7 is a detailed flow chart of a processing executed in step S30 of the flow chart illustrated in FIG. 4. The flow chart illustrated in FIG. 8 is a detailed flow chart of a processing executed in step S40 of the flow chart illustrated in FIG. 4.

Next, a processing executed by the eye pattern evaluating apparatus 1 of the present embodiment constituted as in FIG. 1 will be described in detail in accordance with the flow charts.

[1] Entire Processing

To calculate a margin included in an eye pattern relative to a mask, the eye pattern evaluating unit 15 first finds out a center location on a time axis of an eye pattern opening in step S10 as illustrated in the flow chart of FIG. 4 to calculate the center location of the eye pattern.

Subsequently, in step S20, the eye pattern evaluating unit 15 adopts a condition that the center location of the mask is arranged at the center location of the calculated eye pattern. And, in step S20, the eye pattern evaluating unit 15 calculates a time coordinate value and a voltage coordinate value of each feature point included in the mask under the arrangement to create the mask.

When a maker that provides a receiving device presents a mask as illustrated in FIG. 19, the eye pattern evaluating unit 15 adopts the condition that the center location of the mask is arranged at the location calculated as the center location of the eye pattern. And then, the eye pattern evaluating unit 15 calculates time coordinate values and voltage coordinate values of features points point r, point s, point t, point u, point p, and point q included in the mask under the arrangement.

Subsequently, in step S30, the eye pattern evaluating unit 15 calculates voltage axis margins of feature points included in the mask that are not on the time axis, and, based on the voltage axis margins, calculates a final voltage axis margin.

When a maker that provides a receiving device presents a mask as illustrated in FIG. 19, the eye pattern evaluating unit 15 calculates the voltage axis margins of the features points point r, point s, point t, point u that are not on the time axis, and based on the voltage axis margins, calculates the final voltage axis margin.

Subsequently, in step S40, the eye pattern evaluating unit 15 calculates time axis margins of the features points included in the mask that are on the time axis, and based, on the time axis margins, calculates a final time axis margin.

When a maker that provides a receiving device presents a mask as illustrated in FIG. 19, the eye pattern evaluating unit 15 calculates the time axis margins of the feature points point p and point q on the time axis, and based on the time axis margins, calculates the final time axis margin.

Subsequently, in step S50, the eye pattern evaluating unit 15 displays the final voltage axis margin calculated in step S30 and the final time axis margin calculated in step S40 on the display 16. And then, the eye pattern evaluating unit 15 finishes the processing.

[1-1] Calculation Processing of Eye Pattern Center Location

Next, in accordance with the flow chart of FIGS. 5 and 6, a calculation processing of an eye pattern center location executed in step S10 of the flow chart of FIG. 4 will be described.

The eye pattern evaluating unit 15 proceeds to step S10 of the flow chart of FIG. 4 to enter into the calculation processing of the eye pattern center location. In other words, the eye pattern evaluating unit 15 first reads plot data of start cycles (plot data of two clock cycles) from the plot data file 13 in step S100, and extracts plot data in which the voltage values (voltage coordinate values) are within ±Vth, as illustrated in the flow chart of FIGS. 5 and 6. Vth herein is a threshold set near a zero value.

As can be seen from FIG. 18, there is a case that the plot data having the voltage value within ±Vth is not exist which is to be extracted in step S100. In that case, the eye pattern evaluating unit 15 reads plot data of the next cycles (plot data of two clock cycles).

Subsequently, in step S101, the eye pattern evaluating unit 15 extracts plot data with minimum time value (time coordinate value) from the extracted plot data, and substitutes the time value for a variable "minimum time".

Subsequently, in step S102, the eye pattern evaluating unit 15 determines whether up to the plot data of the final cycles (plot data of two clock cycles) stored in the plot data file 13 is processed. When it is determined that up to the plot data of the final cycles is not processed, the eye pattern evaluating unit 15 proceeds to step S103. In other words, the eye pattern evaluating unit 15 reads plot data of the next cycles (plot data of two clock cycles) from the plot data file 13, and extracts plot data in which the voltage value is within ±Vth.

As can be seen from FIG. 18, there is a case that the plot data having the voltage value within ±Vth is not exist which is to be extracted in step S103. In that case, the eye pattern evaluating unit 15 reads plot data of the next cycles (plot data of two clock cycles).

Subsequently, in step S104, the eye pattern evaluating unit 15 extracts data with minimum time value from the extracted plot data.

Subsequently, in step S105, the eye pattern evaluating unit 15 determines whether the time value of the extracted plot data is smaller than the value of the variable "minimum time". And then, in the following step S106, the eye pattern evaluating unit 15 determines whether a determination result "smaller" is obtained.

When it is determined that the time value of the extracted plot data is smaller than the value of the variable "minimum time" according to the determination processing, the eye pattern evaluating unit 15 proceeds to step S107. In other words, the eye pattern evaluating unit 15 rewrites the value of the variable "minimum time" according to the time value of the extracted plot data, and then returns to the processing of step S102.

On the other hand, when it is determined that the time value of the extracted plot data is larger than the value of the variable "minimum time" according to the determination processing, the eye pattern evaluating unit 15 immediately returns to the processing of step S102 without executing the processing of step S107.

In this way, the processing of steps S102 to S107 are repeated. And then, when it is determined that up to the plot data of the final cycles stored in the plot data file 13 is processed in step S102, the eye pattern evaluating unit 15 proceeds to step S108. In other words, the eye pattern evaluating unit 15 determines the value of the variable "minimum time" as the minimum time.

Subsequently, in step S109, the eye pattern evaluating unit 15 reads the plot data of the start cycles (plot data of two clock cycles) from the plot data file 13, and extracts plot data in which the voltage value is within ±Vth.

As can be seen from FIG. 18, there is a case that the plot data having the voltage value within ±Vth is not exist which is to be extracted in step S109. In that case, the eye pattern evaluating unit 15 reads plot data of the next cycles (plot data of two clock cycles).

Subsequently, in step S110, the eye pattern evaluating unit 15 extracts plot data with maximum time value from the extracted plot data, and substitutes the time value for the variable "maximum time".

Subsequently, in step S111, the eye pattern evaluating unit 15 determines whether up to the plot data of the final cycles (plot data of two clock cycles) stored in the plot data file 13 is processed. When it is determined that up to the plot data of the final cycles is not processed, the eye pattern evaluating unit 15 proceeds to step S112. In other words, the eye pattern evaluating unit 15 reads plot data of the next cycles (plot data of two clock cycles) from the plot data file 13, and extracts plot data in which voltage value is within ±Vth.

As can be seen from FIG. 18, there is a case that the plot data having the voltage value within ±Vth is not exist which is to be extracted in step S112. In that case, the eye pattern evaluating unit 15 reads plot data of the next cycles (plot data of two clock cycles).

Subsequently, in step S113, the eye pattern evaluating unit 15 extracts plot data with maximum time value from the extracted plot data.

Subsequently, in step S114, the eye pattern evaluating unit 15 determines whether the time value of the extracted plot data is greater than the value of the variable "maximum time". And then, in step S115, the eye pattern evaluating unit 15 determines whether a determination result "larger" is obtained.

When it is determined that the time value of the extracted plot data is larger than the value of the variable "maximum time" according to the determination processing, the eye pattern evaluating unit 15 proceeds to step S116. In other words, the eye pattern evaluating unit 15 rewrites the value of the variable "maximum time" according to the time value of the extracted plot data, and then returns to the processing of step S111.

On the other hand, when it is determined that the time value of the extracted plot data is smaller than the value of the variable "maximum time" according to the determination processing, the eye pattern evaluating unit 15 immediately returns to the processing of step S111 without executing the processing of step S116.

In this way, when it is determined that up to the plot data of the final cycles stored in the plot data file 13 is processed in step S111 after repetitions of the processing of steps S111 to S116, the eye pattern evaluating unit 15 proceeds to step S117. In other words, the eye pattern evaluating unit 15 determines the value of the variable "maximum time" as the maximum time.

Subsequently, in step S118, the eye pattern evaluating unit 15 obtains the middle location between the minimum time determined in step S108 and the maximum time determined in step S117, and determine the middle location as the center location of the eye pattern. And then, the eye pattern evaluating unit 15 finishes the processing.

Figure 9:
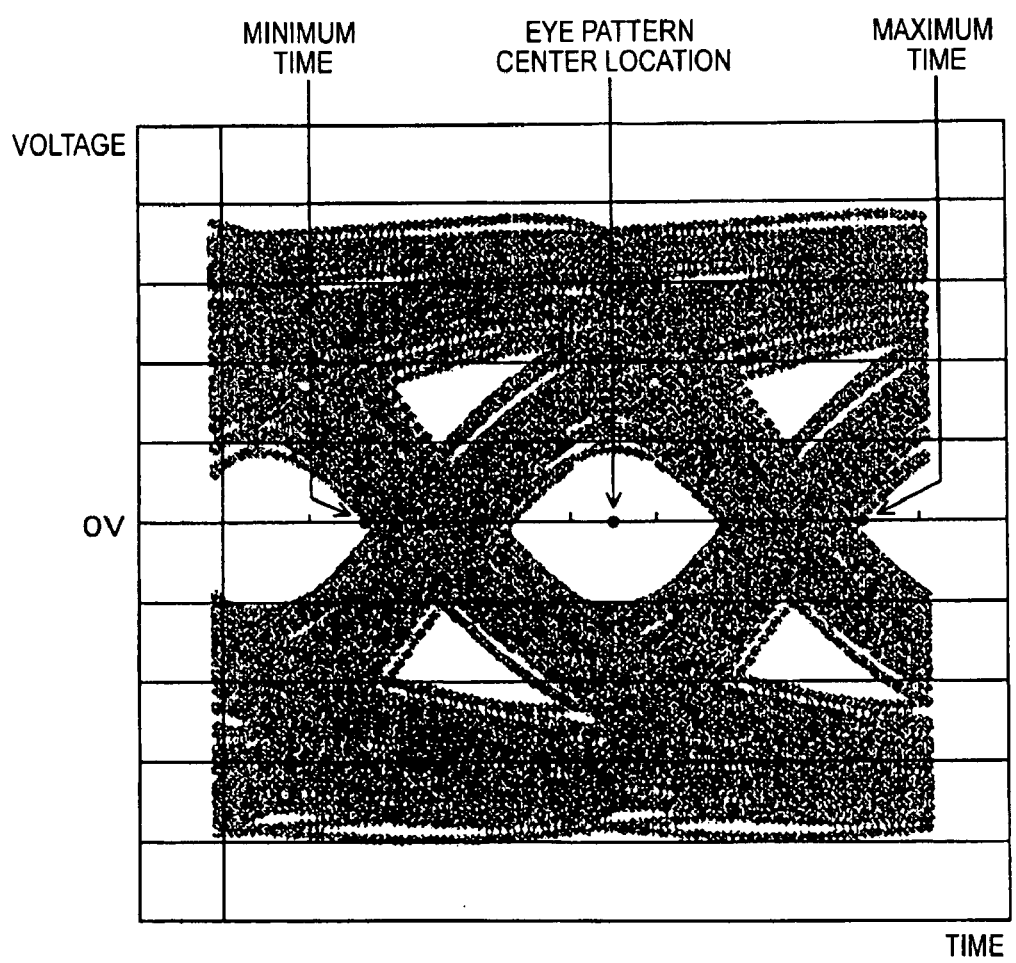
FIG. 9 is an explanatory view of a calculation processing of an eye pattern center location.

In this way, the eye pattern evaluating unit 15 executes the calculation processing of the eye pattern center location in the step S10 of the flow chart of FIG. 4. In other words, the eye pattern evaluating unit 15 obtains the time coordinate value of the minimum time illustrated in FIG. 9 according to the processing of steps S100 to S108, obtains the time coordinate value of the maximum time illustrated in FIG. 9 according to the processing of steps S109 to S117, and obtains the middle locations of the two time coordinate values (=(minimum time+maximum time)/2). As a result of the above processing, the center location of the eye pattern illustrated in FIG. 9 is calculated.

[1-2] Mask Creation Processing

When the center location of the eye pattern is calculated according to the processing of step S10 of the flow chart of FIG. 4, the eye pattern evaluating unit 15 arranges the center location of the mask at the center location of the calculated eye pattern according to the processing of step S20 of the flow chart of FIG. 4 as described above. As a result, the eye pattern evaluating unit 15 creates a mask in a form illustrated in FIG. 10.

[1-3] Calculation Processing of Voltage Axis Margin

Next, a calculation processing of the voltage axis margins executed in step S30 of the flow chart of FIG. 4 will be described in accordance with the flow chart of FIG. 7.

Before entering into the calculation processing of the voltage axis margins, the eye pattern evaluating unit 15 calculates the time coordinate values and the voltage coordinate values of the feature points included in the mask in accordance with the processing of step S20 of the flow chart of FIG. 4. In the calculation processing of the voltage axis margins, the eye pattern evaluating unit 15 executes a processing of the flow chart of FIG. 7 for the feature points not on the time axis among the feature points, and, based on the voltage axis margins of the feature points obtained by the execution of the processing, executes a processing of calculating the final voltage axis margin.

That is, when a maker that provides a receiving device presents a mask as illustrated in FIG. 19, the eye pattern evaluating unit 15 executes the processing of the flow chart of FIG. 7 for the feature points, in other words, point r, point s, point t, and point u. And, based on the voltage axis margins of the feature points obtained by the execution of the above processing, the eye pattern evaluating unit 15 executes a processing of calculating the final voltage axis margin.

After selecting one of the feature points not on the time axis and entering into the calculation processing of the voltage axis margins, the eye pattern evaluating unit 15 first specifies the time location of the plot data closest to the feature point in step S300 as illustrated in the flow chart of FIG. 7.

Figure 11:
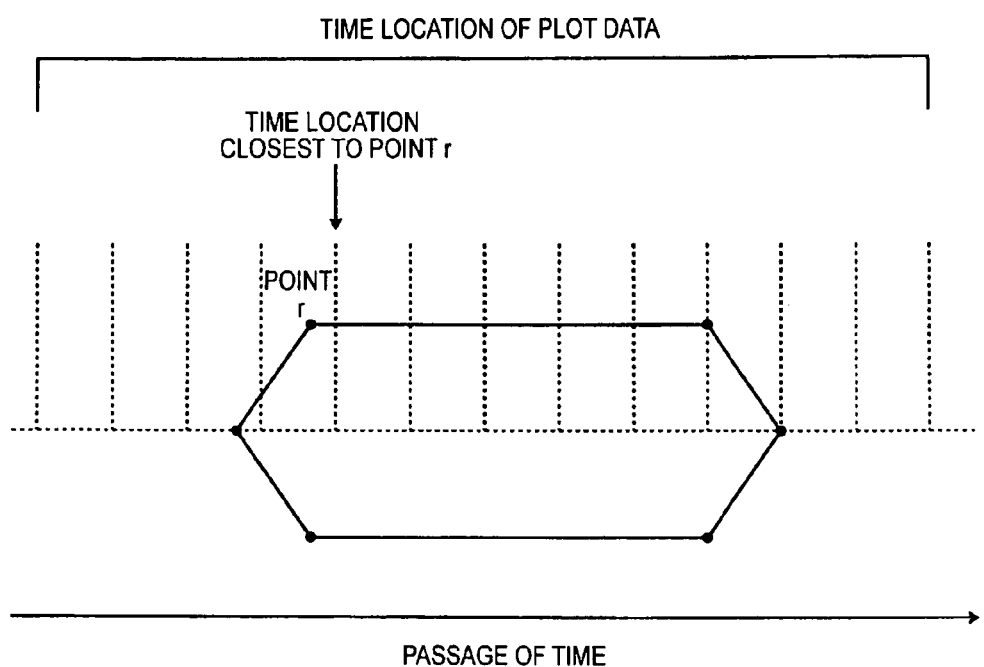
FIG. 11 is an explanatory view of a time location of plot data.

As illustrated in FIG. 3, the plot data of the cycles (plot data of two clock cycles) is constituted by waveform voltage values sampled at a certain time interval and is plotted according to the relative time value from the top to form an eye pattern. In this way, as illustrated in FIG. 11, the time location of the plot data closest to the feature point is uniquely determined, and thus, the time location is specified.

Subsequently, in step S301, the eye pattern evaluating unit 15 reads the plot data of the start cycles (plot data of two clock cycles) from the plot data file 13, and extracts a plot data part to be processed from the read plot data depending on whether the mask voltage of the feature point is positive or negative.

Figure 12A:
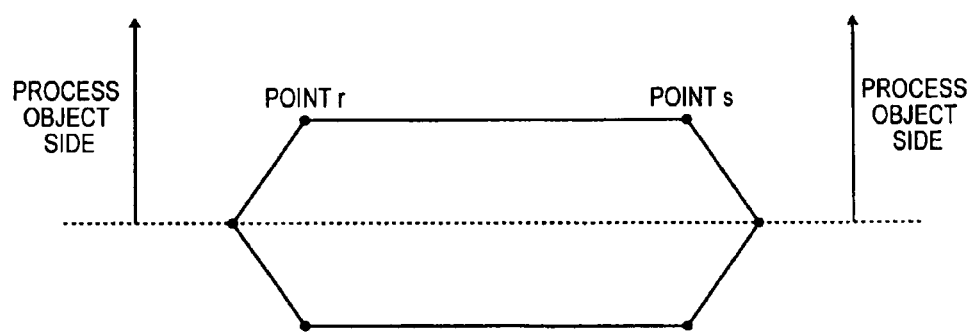
FIGS. 12A, 12B, 13A and 13B are explanatory views of the plot data extraction processing.
Figure 12B:
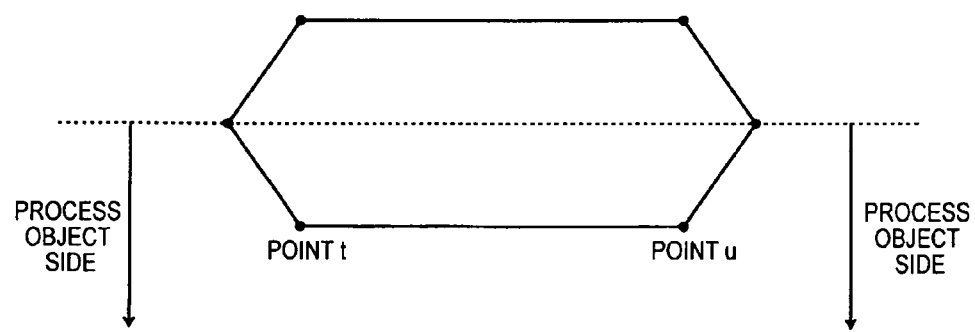

Since the mask voltages of the feature points point r and point s illustrated in FIG. 19 are positive voltages, the eye pattern evaluating unit 15 extracts plot data parts having positive voltage values as processing objects, as illustrated in FIG. 12A. On the other hand, since the mask voltages of the feature points point t and point u illustrated in FIG. 19 are negative voltages, the eye pattern evaluating unit 15 extracts plot data parts having negative voltage values as processing objects, as illustrated in FIG. 12B.

As can be seen from FIG. 18, there is a case that the plot data is not exist which is to be extracted in step S301 as a processing object. In that case, the eye pattern evaluating unit 15 reads the plot data of the next cycles (plot data of two clock cycles).

Subsequently, in step S302, the eye pattern evaluating unit 15 sets the plot data parts extracted in step S301 as processing objects, and extracts plot data at the time location specified in step S300 included in the plot data parts to extract the voltage value of the plot data of the time location closest to the feature point.

Subsequently, in step S303, the eye pattern evaluating unit 15 calculates a difference voltage value between the mask voltage of the feature point and the extracted voltage value, and substitutes the difference voltage value for a variable "minimum difference voltage value". In the above calculation of the difference voltage value, the eye pattern evaluating unit 15 sets a negative sign to the difference voltage value to be calculated when the extracted voltage value enters into the eye pattern, sets a positive sign to the difference voltage value to be calculated when the extracted voltage value does not enter into the eye pattern.

Subsequently, in step S304, the eye pattern evaluating unit 15 determines whether up to the plot data of the final cycles (plot data of two clock cycles) stored in the plot data file 13 is processed. When it is determined that up to the plot data of the final cycles is not processed, the eye pattern evaluating unit 15 proceeds to step S305. In other words, the eye pattern evaluating unit 15 reads plot data of the next cycles (plot data of two clock cycles) from the plot data file 13. And, the eye pattern evaluating unit 15 extracts plot data parts to be processed from the read plot data depending on whether the mask voltages of the features points are positive or negative, according to a processing equivalent to the processing of step S301.

As can be seen from FIG. 18, there is a case that the plot data is not exist which is to be extracted in step S305 as a processing object. In that case, the eye pattern evaluating unit 15 reads the plot data of the next cycles (plot data of two clock cycles).

Subsequently, in step S306, the eye pattern evaluating unit 15 sets the plot data parts extracted in step S305 as processing objects, and extracts plot data at the time location specified in step S300 included in the plot data parts. As a result, the eye pattern evaluating unit 15 extracts the voltage value of the plot data of the time location closest to the feature point.

Subsequently, in step S307, the eye pattern evaluating unit 15 calculates a difference voltage value between the mask voltage value of the feature point and the extracted voltage value. In the above calculation of the difference voltage value, the eye pattern evaluating unit 15 sets a negative sign to the difference voltage value to be calculated when the extracted voltage value enters into the eye pattern, sets a positive sign to the difference voltage value to be calculated when the extracted voltage value does not enter into the eye pattern.

Subsequently, in step S308, the eye pattern evaluating unit 15 determines whether the calculated difference voltage value is smaller than the value of the variable "minimum difference voltage value". And then, in step S309, the eye pattern evaluating unit 15 determines whether a determination result "smaller" is obtained. In this case, the eye pattern evaluating unit 15 determines, in the determination processing, that a difference voltage value with a negative sign is smaller than a difference voltage value with a positive sign, and that a difference voltage value with a larger absolute value is smaller when both difference voltage values have negative signs, according to a normal mathematical logic.

When it is determined that the calculated difference voltage value is smaller than the value of the variable "minimum difference voltage value" according to the determination processing, the eye pattern evaluating unit 15 proceeds to step S310. In other words, the eye pattern evaluating unit 15 rewrites the value of the variable "minimum difference voltage value" in accordance with the calculated difference voltage value, and then returns to the processing of step S304.

On the other hand, when it is determined that the calculated difference voltage value is larger than the value of the variable "minimum difference voltage value" according to the determination processing, the eye pattern evaluating unit 15 immediately returns to the processing of step S304 without executing the processing of step S310.

In this way, the processing of steps S304 to S310 are repeated. And then, when it is determined that up to the plot data of the final cycles stored in the plot data file 13 is processed in step S304, the eye pattern evaluating unit 15 proceeds to step S311. In other words, the eye pattern evaluating unit 15 determines the value of the variable "minimum difference voltage value" as the voltage axis margin of the processed feature point.

When there are a plurality of feature points not on the time axis, the eye pattern evaluating unit 15 executes the processing of the flow chart of FIG. 7 to the feature points to thereby calculate the margins in the voltage axis direction of the feature points.

Based on the calculated margins in the voltage axis direction of the feature points, the eye pattern evaluating unit 15, for example, specifies the minimum margin among the margins, and determines the minimum margin as the margin in the voltage axis direction.

As described, a negative sign is set to the difference voltage value upon calculation when the plot data enters into the eye pattern, and a positive sign is set to the difference voltage value upon calculation when the plot data does not enter into the eye pattern. Further, the minimum margin of the margins in the voltage axis direction calculated for the feature points is specified, and set the specified minimum margin as the final voltage axis margin. Accordingly, the eye pattern evaluating unit 15 calculates the difference voltage value that enters into the eye pattern to the greatest extent as the final voltage axis margin, when the plot data enters into the eye pattern. And, the eye pattern evaluating unit 15 calculates the difference voltage value closest to the eye pattern as the final voltage axis margin, when the plot data does not enter into the eye pattern.

[1-4] Calculation Processing of Time Axis Margin

Next, a calculation processing of the time axis margin executed in step S40 of the flow chart of FIG. 4 will be described in accordance with the flow chart of FIG. 8.

Before entering into the calculation processing of the time axis margin, the eye pattern evaluating unit 15 calculates the time coordinate values and the voltage coordinate values of the feature points included in the mask in accordance with the processing of step S20 of the flow chart of FIG. 4. In the calculation processing of the time axis margin, the eye pattern evaluating unit 15 executes the processing of the flow chart of FIG. 8 to the feature points on the time axis among the feature points, and, based on the time axis margins of the feature points obtained by the execution, executes the processing of calculating the final time axis margin.

Thus, when a maker that provides a receiving device presents a mask as illustrated in FIG. 19, the eye pattern evaluating unit 15 executes the processing of the flow chart of FIG. 8 for the feature points point p and point q, and, based on the time axis margins of the feature points obtained by the execution of the processing, executes a processing of calculating the final time axis margin.

The eye pattern evaluating unit 15 selects one of the feature points on the time axis, and enters into the calculation processing of the time axis margins. In other words, the eye pattern evaluating unit 15 first reads the plot data of the start cycles (plot data of two clock cycles) from the plot data file 13 in step S400, as illustrated in the flow chart of FIG. 8, and extracts plot data parts to be processed from the read plot data. The plot data parts to be processed have a voltage value within ±Vth, and correspond to the time location of the feature points.

Figure 13A:
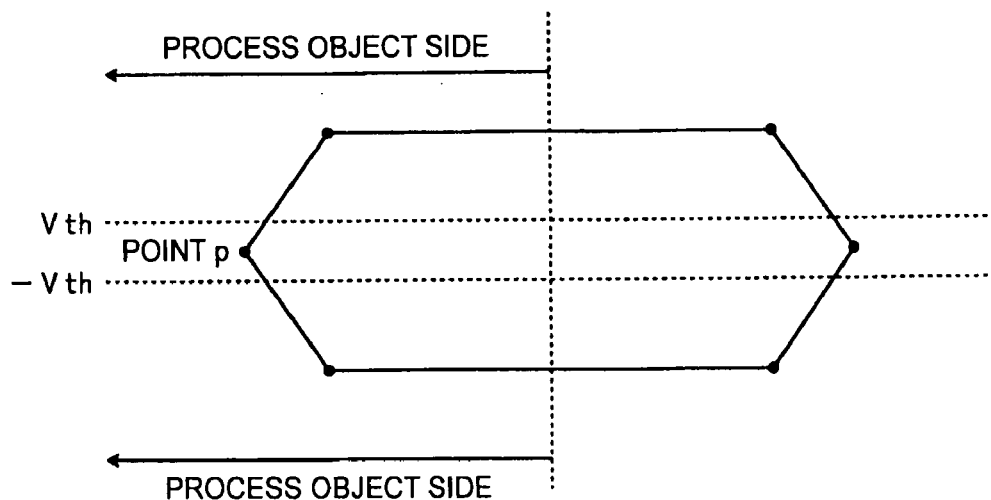
Figure 13B:
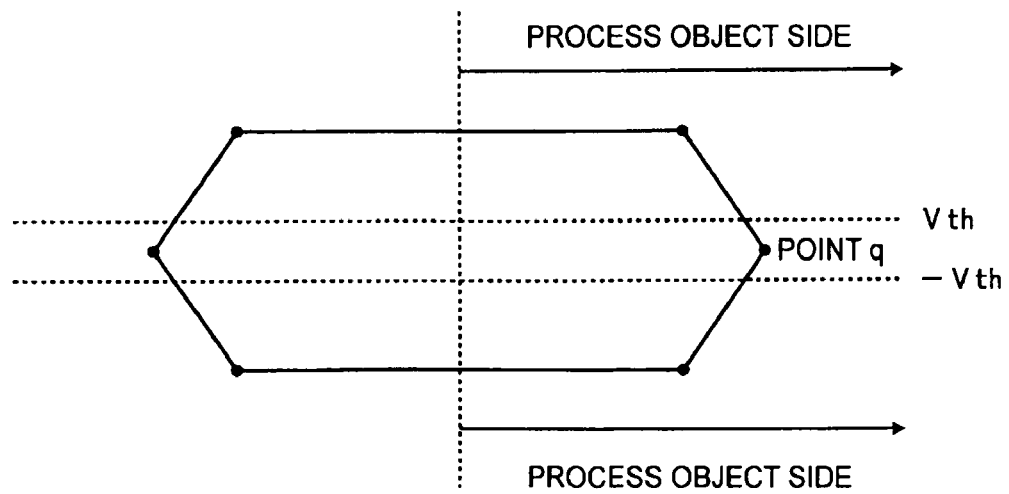

Since the time location of the feature point p illustrated in FIG. 19 is temporally before the center location of the eye pattern, the eye pattern evaluating unit 15 extracts a plot data part in which the voltage value is within ±Vth and that is temporally before the center location of the eye pattern as a processing object, as illustrated in FIG. 13A. On the other hand, since the time location of the feature point q illustrated in FIG. 19 is temporally after the center location of the eye pattern, the eye pattern evaluating unit 15 extracts a plot data part in which the voltage value is within ±Vth and that is temporally after the center location of the eye pattern as a processing object, as illustrated in FIG. 13B.

As can be seen from FIG. 18, there is a case that the plot data is not exist which is to be extracted in step S400. In that case, the eye pattern evaluating unit 15 reads the plot data of the next cycles (plot data of two clock cycles).

Subsequently, in step S401, the eye pattern evaluating unit 15 sets the plot data parts extracted in step S400 as processing objects, and specifies the plot data, in which the voltage value is closest to zero, included in the plot data parts to extract the time value of the plot data.

Subsequently, in step S402, the eye pattern evaluating unit 15 calculates a difference time value between the time value of the feature point and the extracted time value, and substitutes the difference time value for a variable "minimum difference time value". In the above calculation of the difference time value, the eye pattern evaluating unit 15 sets a negative sign to the difference time value to be calculated when the extracted time value enters into the eye pattern, sets a positive sign to the difference time value to be calculated when the extracted time value does not enter into the eye pattern.

Subsequently, in step S403, the eye pattern evaluating unit 15 determines whether up to the plot data of the final cycles (plot data of two clock cycles) stored in the plot data file 13 is processed is determined. When it is determined that up to the plot data of the final cycles is not processed, the eye pattern evaluating unit 15 proceeds to step S404. In other words, the eye pattern evaluating unit 15 reads plot data of the next cycles (plot data of two clock cycles) from the plot data file 13, and extracts plot data parts to be processed, which have a voltage value within ±Vth and correspond to the time location of the feature points, from the read plot data, according to a processing equivalent to the processing of step S400.

As can be seen from FIG. 18, there is a case that the plot data is not exist which is to be extracted in step S404. In that case, the eye pattern evaluating unit 15 reads the plot data of the next cycles (plot data of two clock cycles).

Subsequently, in step S405, the eye pattern evaluating unit 15 sets the plot data parts extracted in step S400 as processing objects, and specifies the plot data, in which the voltage value is closest to zero, included in the plot data parts to extract the time value of the plot data.

Subsequently, in step S406, the eye pattern evaluating unit 15 calculates a difference time value between the time value of the feature point and the extracted time value. In the above calculation of the difference time value, the eye pattern evaluating unit 15 sets a negative sign to the difference time value to be calculated when the extracted time value enters into the eye pattern, sets a positive sign to the difference time value to be calculated when the extracted time value does not enter into the eye pattern.

Subsequently, in step S407, the eye pattern evaluating unit 15 determines whether the calculated difference time value is smaller than the value of the variable "minimum difference time value". And then, in step S408, the eye pattern evaluating unit 15 determines whether a determination result "smaller" is obtained. In this case, the eye pattern evaluating unit 15 determines, in the determination processing, that a difference time value with a negative sign is smaller than a difference time value with a positive sign, and that a difference time value with a larger absolute value is smaller when both difference time values have negative signs, according to a normal mathematical logic.

When it is determined that the calculated difference time value is smaller than the value of the variable "minimum difference time value" according to the determination processing, the eye pattern evaluating unit 15 proceeds to step S409. In other words, the eye pattern evaluating unit 15 rewrites the value of the variable "minimum difference time value" in accordance with the calculated difference time value, and then returns to the processing of step S403.

On the other hand, when it is determined that the calculated difference time value is larger than the value of the variable "minimum difference time value" according to the determination processing, the eye pattern evaluating unit 15 immediately returns to the processing of step S403 without executing the processing of step S409.

In this way, the processing of steps S403 to S409 are repeated. And, when it is determined that up to the plot data of the final cycles stored in the plot data file 13 is processed in step S403, the eye pattern evaluating unit 15 proceeds to step S410. In other words, the eye pattern evaluating unit 15 determines the value of the variable "minimum difference time value" as the time axis margin of the processed feature point.

When there is a plurality of feature points on the time axis, the eye pattern evaluating unit 15 executes the processing of the flow chart of FIG. 8 to the feature points to thereby calculate the margins in the time axis direction of the feature points.

Based on the calculated margins in the time axis direction of the feature points, the eye pattern evaluating unit 15, for example, specifies the minimum margin among the margins, and determines the minimum margin as the margin in the time axis direction.

As described, a negative sign is set to the difference time value upon calculation when the plot data enters into the eye pattern, and a positive sign is set to the difference time value upon calculation when the plot data does not enter into the eye pattern. Further, the minimum margin of the margins in the time axis direction calculated for the feature points is specified to set the minimum margin as the final time axis margin. Accordingly, the eye pattern evaluating unit 15 calculates the difference time value that enters into the eye pattern to the greatest extent as the final time axis margin when the plot data enters into the eye pattern. And, the eye pattern evaluating unit 15 calculates the difference time value closest to the eye pattern as the final time axis margin when the plot data does not enter into the eye pattern.

In this way, the eye pattern evaluating unit 15 executes the flow charts of FIGS. 4 to 8 to realize automatic calculation of the margins included in the eye pattern generated by the simulator relative to the mask serving as a quality evaluation criterion.

In the calculation of the margins, the eye pattern evaluating unit 15 may take the characteristics of the clock data recovery, which is built in the receiving device, into consideration, in other words, may arrange the mask, which serves as a quality evaluation criterion, at the center location on the time axis of the eye pattern opening, to calculate the margins. Thus, the eye pattern evaluating unit 15 realizes the calculation of accurate margins required when the receiving device actually operates.

In the embodiment described above, the plot data closest to the feature points is extracted to execute the calculation processing of the eye pattern center location (processing described in [1-1]), the calculation processing of the time axis margin (processing described in [1-3]), and the calculation processing of the time axis margin (processing described in [1-4]). However, a method may be employed in which the time values and voltage values of the plot data at feature point locations are estimated by a linear interpolation method, and the calculation processing of the eye pattern center location, the calculation processing of the voltage axis margin, and the calculation processing of the time axis margin are executed based on the estimation to improve the accuracy of the margin calculation processing.

FIGS. 14 to 17 illustrate examples of flow charts executed by the eye pattern evaluating unit 15, when using the above method.

Figure 14:
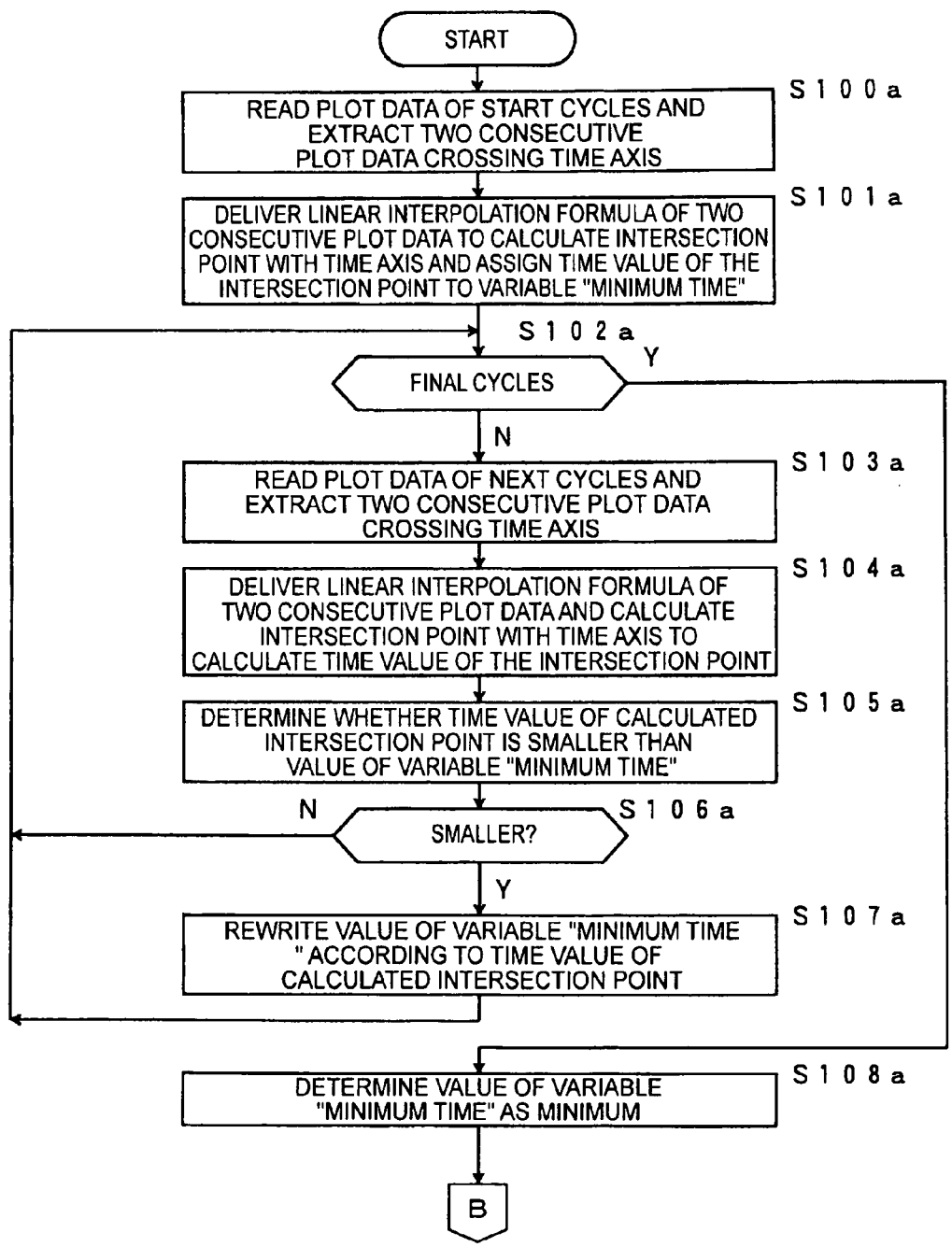
FIGS. 14, 15 and 16 are examples of flow charts executed by the eye pattern evaluating unit.
Figure 15:
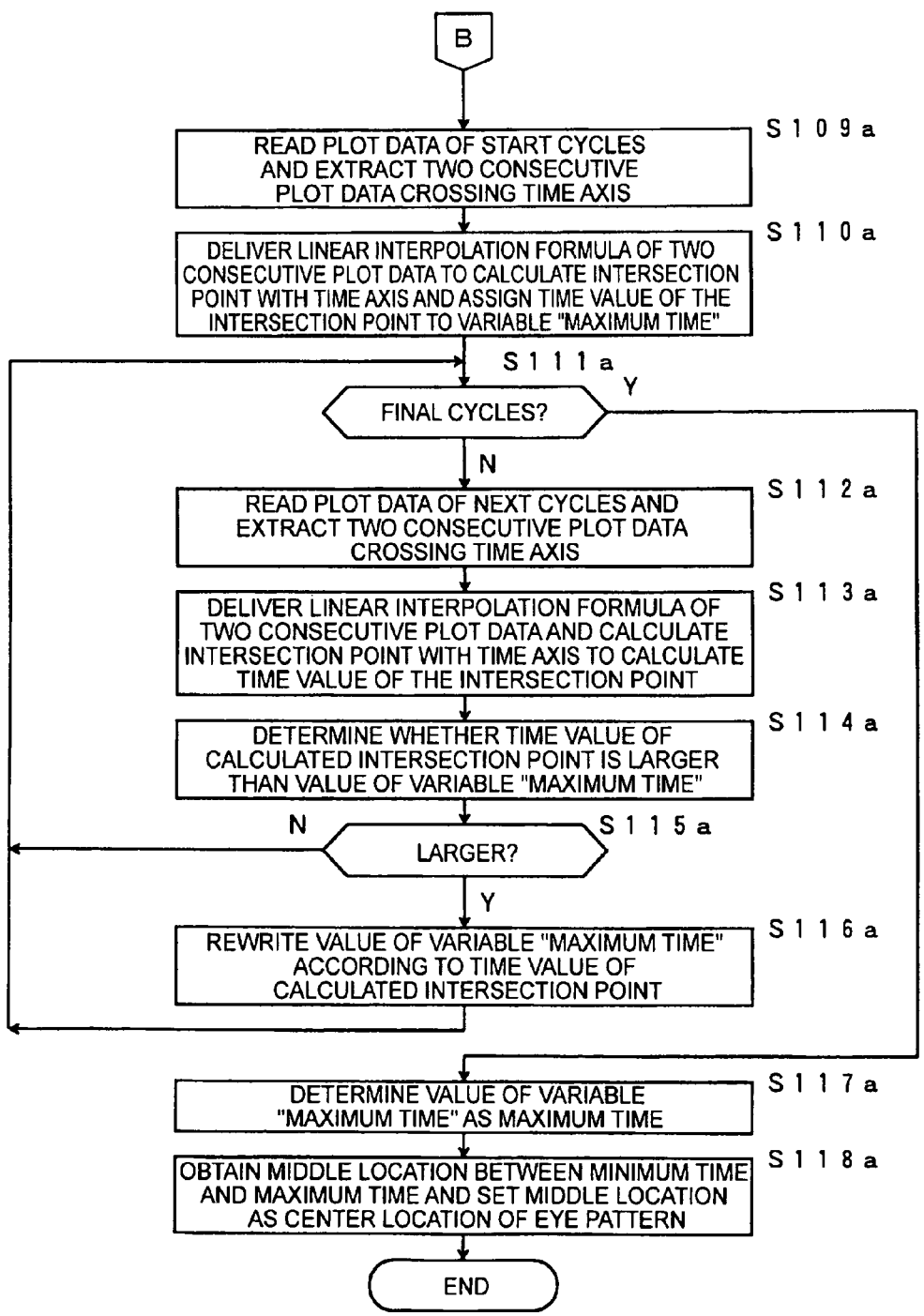
Figure 16:
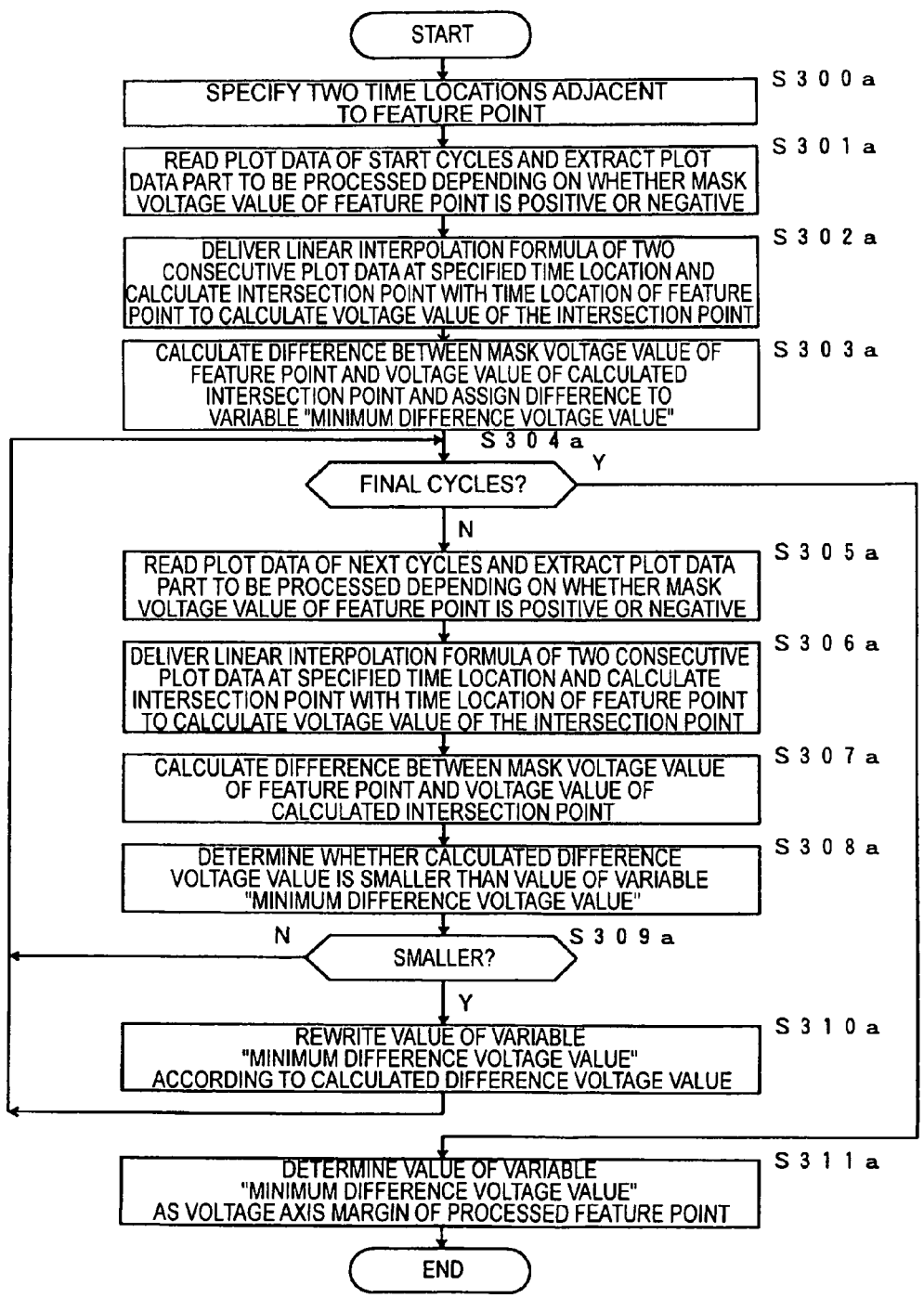
Figure 17:
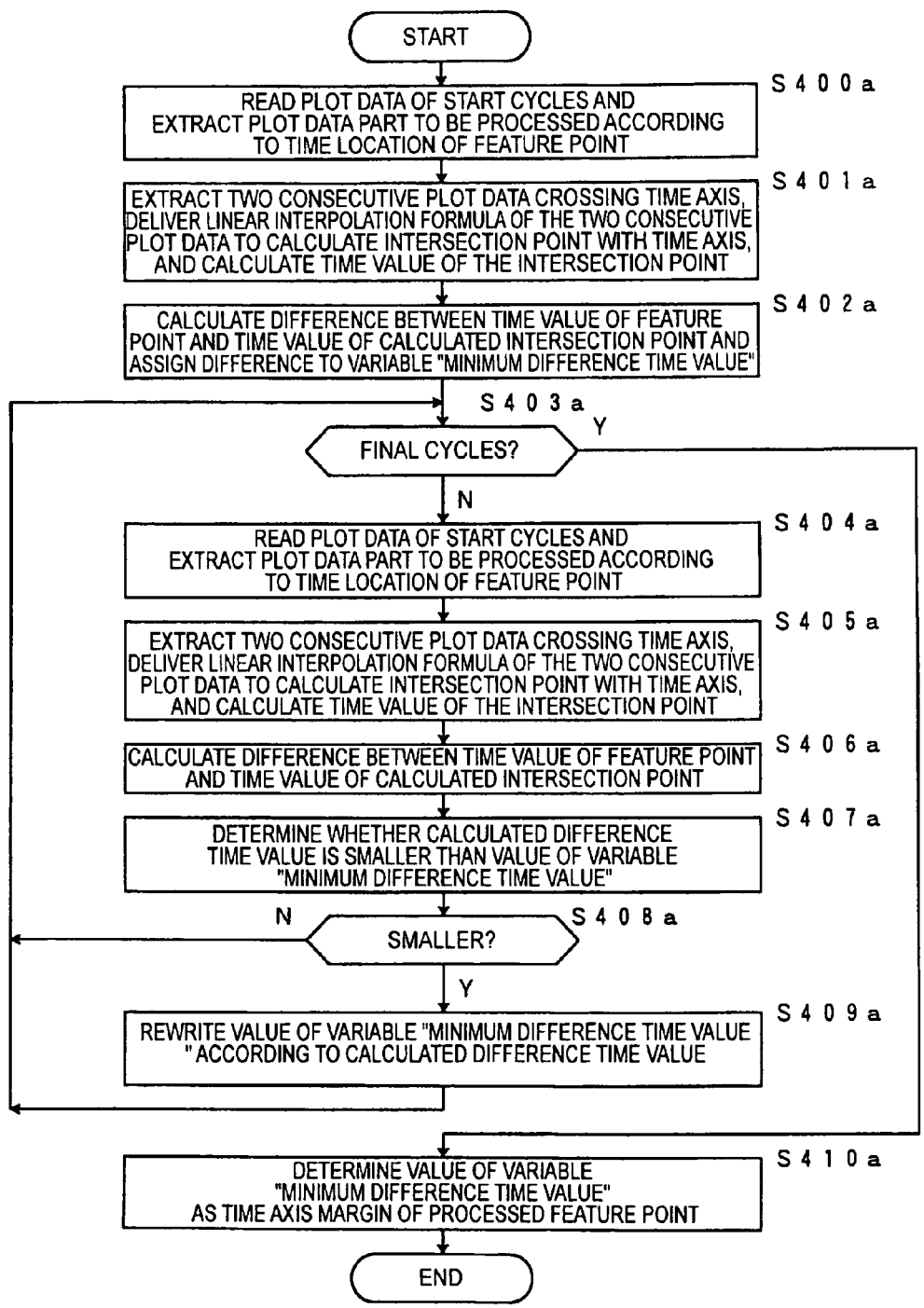
FIG. 17 is an explanatory view of a calculation processing of the eye pattern center location.

The flow chart illustrated in FIGS. 14 and 15 is a detailed flow chart of the processing executed in step S10 of the flow chart illustrated in FIG. 4. The flow chart illustrated in FIG. 16 is a detailed flow chart of the processing executed in step S30 of the flow chart illustrated in FIG. 4. The flow chart illustrated in FIG. 17 is a detailed flow chart of the processing executed in step S40 of the flow chart illustrated in FIG. 4.

Next, the processing executed by the eye pattern evaluating apparatus 1 when using the method will be described in detail in accordance with the flow charts.

[2-1] Calculation Processing of Eye Pattern Center Location

In the case that the center location of the eye pattern is calculated according to the flow chart of FIGS. 14 and 15, the eye pattern evaluating unit 15 proceeds to step S10 of the flow chart of FIG. 4 to enter the calculation processing of the eye pattern center location. In other words, the eye pattern evaluating unit 15 first reads the plot data of the start cycles (plot data of two clock cycles) from the plot data file 13 in step S100a, and extracts two continuous plot data crossing 0 V (time axis) from the plot data.

Subsequently, in step S101a, the eye pattern evaluating unit 15 works out a linear interpolation formula, which is obtained by the extracted two continuous plot data, and calculates the intersection point between the linear interpolation formula and the time axis. And then, the eye pattern evaluating unit 15 substitutes the calculated time value for a variable "minimum time".

As can be seen from FIG. 18, there is a case that two continuous plot data crossing 0 V (time axis) is not exist which is to be extracted in step S100a. In that case, the eye pattern evaluating unit 15 reads the plot data of the next cycles (plot data of two clock cycles).

Subsequently, in step S102a, the eye pattern evaluating unit 15 determines whether up to the plot data of the final cycles (plot data of two clock cycles) stored in the plot data file 13 is processed is determined. When it is determined that up to the plot data of the final cycles is not processed, the eye pattern evaluating unit 15 proceeds to step S103a. In other words, the eye pattern evaluating unit 15 reads plot data of the next cycles (plot data of two clock cycles) from the plot data file 13, and extracts two continuous plot data crossing 0 V (time axis) from the plot data.

Subsequently, in step S104a, the eye pattern evaluating unit 15 works out a linear interpolation formula, which is obtained by the extracted two continuous plot data, and calculates the intersection point between the linear interpolation formula and the time axis, in other words, calculates the time value of the intersection point.

As can be seen from FIG. 18, there is a case that two continuous plot data crossing 0 V (time axis) is not exist which is to be extracted in step S103a. In that case, the eye pattern evaluating unit 15 reads the plot data of the next cycles (plot data of two clock cycles).

Subsequently, in step S105a, the eye pattern evaluating unit 15 determines whether the calculated time value of the intersection point is smaller than the value of the variable "minimum time". And then, in step S106a, the eye pattern evaluating unit 15 determines whether a determination result "smaller" is obtained.

When it is determined that the calculated time value of the intersection point is smaller than the value of the variable "minimum time" according to the determination processing, the eye pattern evaluating unit 15 proceeds to step S107a. In other words, the eye pattern evaluating unit 15 rewrites the value of the variable "minimum time" in accordance with the calculated time value of the intersection point, and then returns to the processing of step S102a.

On the other hand, when it is determined that the calculated time value of the intersection point is larger than the value of the variable "minimum time" according to the determination processing, the eye pattern evaluating unit 15 immediately returns to the processing of step S102a without executing the processing of step S107a.

In this way, the processing of steps S102a to S107a are repeated. And, when it is determined that up to the plot data of the final cycles stored in the plot data file 13 is processed in step S102a, the eye pattern evaluating unit 15 proceeds to step S108a. In other words, the eye pattern evaluating unit 15 determines the value of the variable "minimum time" as the minimum time.

Subsequently, in step S109a, the eye pattern evaluating unit 15 reads the plot data of the start cycles (plot data of two clock cycles) from the plot data file 13, and extracts two continuous plot data crossing 0 V (time axis) from the plot data.

Subsequently, in step S110a, the eye pattern evaluating unit 15 works out a linear interpolation formula, which is obtained by the extracted two continuous plot data, and calculates the intersection point between the linear interpolation formula and the time axis. And then, the eye pattern evaluating unit 15 substitutes the calculated time value for a variable "maximum time".

As can be seen from FIG. 18, there is a case that two continuous plot data crossing 0 V (time axis) is not exist which is to be extracted in step S109a. In that case, the eye pattern evaluating unit 15 reads the plot data of the next cycles (plot data of two clock cycles).

Subsequently, in step S111a, the eye pattern evaluating unit 15 determines whether up to the plot data of the final cycles (plot data of two clock cycles) stored in the plot data file 13 is processed. When it is determined that up to the plot data of the final cycles is not processed, the eye pattern evaluating unit 15 proceeds to step S112a. In other words, the eye pattern evaluating unit 15 reads plot data of the next cycles (plot data of two clock cycles) from the plot data file 13, and extracts two continuous plot data crossing 0 V (time axis) from the plot data.

Subsequently, in step S113a, the eye pattern evaluating unit 15 works out a linear interpolation formula, which is obtained by the extracted two continuous plot data, and calculates the intersection point between the linear interpolation formula and the time axis, in other words, calculates the time value of the intersection point.

As can be seen from FIG. 18, there is a case that two continuous plot data crossing 0 V (time axis) is not exist which is to be extracted in step S112a. In that case, the eye pattern evaluating unit 15 reads the plot data of the next cycles (plot data of two clock cycles).

Subsequently, in step S114a, the eye pattern evaluating unit 15 determines whether the calculated time value of the intersection point is larger than the value of the variable "maximum time". And then, in step S115a, the eye pattern evaluating unit 15 determines whether a determination result "larger" is obtained.

When it is determined that the calculated time value of the intersection point is larger than the value of the variable "maximum time" according to the determination processing, the eye pattern evaluating unit 15 proceeds to step S116a. In other words, the eye pattern evaluating unit 15 rewrites the value of the variable "maximum time" in accordance with the calculated time value of the intersection point, and then returns to the processing of step S111a.

On the other hand, when it is determined that the calculated time value of the intersection point is smaller than the value of the variable "maximum time" according to the determination processing, the eye pattern evaluating unit 15 immediately returns to the processing of step S111a without executing the processing of step S116a.

In this way, the processing of steps S111a to S116a are repeated. And, when it is determined that up to the plot data of the final cycles stored in the plot data file 13 is processed in step S111a, the eye pattern evaluating unit 15 proceeds to step S117a. In other words, the eye pattern evaluating unit 15 determines the value of the variable "maximum time" as the maximum time.

Subsequently, in step S118a, the eye pattern evaluating unit 15 obtains the middle location between the minimum time determined in step S108a and the maximum time determined in step S117a, and determines the middle location as the center location of the eye pattern. And then, the eye pattern evaluating unit 15 finishes the processing.

In this way, the eye pattern evaluating unit 15 executes the calculation processing of the eye pattern center location in the step S10 of the flow chart of FIG. 4. In other words, the eye pattern evaluating unit 15 estimates the time value of the plot data intersecting with the time axis according to the linear interpolation method, obtains the time coordinate value of the minimum time and the time coordinate value of the maximum time illustrated in FIG. 9. As a result of the above processing, the center location of the eye pattern illustrated in FIG. 9 is calculated.

[2-2] Mask Creation Processing

Figure 10:
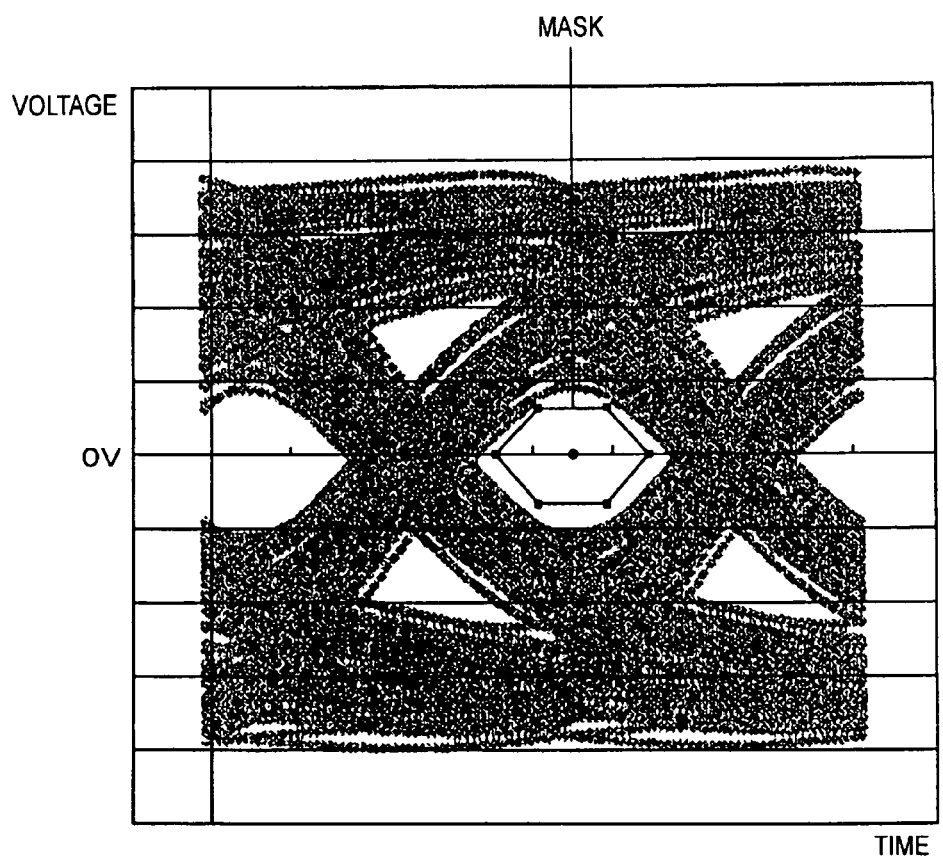
FIG. 10 is an explanatory view of a mask creation processing.

The center location of the eye pattern is calculated according to the processing of step S10 of the flow chart of FIG. 4. Then, the eye pattern evaluating unit 15 arranges the center location of the mask at the center location of the calculated eye pattern according to the processing of step S20 of the flow chart of FIG. 4 as described above. As a result, a mask in a form as illustrated in FIG. 10 is created.

[2-3] Calculation Processing of Voltage Axis Margin

To calculate the voltage axis margin in accordance with the flow chart of FIG. 16, the eye pattern evaluating unit 15 proceeds to step S30 of the flow chart of FIG. 4. In other words, the eye pattern evaluating unit 15 selects one of the feature points not on the time axis, and enters into the calculation processing of the voltage axis margin concerning the feature point. And, the eye pattern evaluating unit 15 first specifies the time locations of two plot data adjacent to the feature point in step S300a.

As illustrated in FIG. 3, the plot data of the cycles (plot data of two clock cycles) is constituted by waveform voltage values sampled at a certain time interval and is plotted according to the relative time value from the top to form an eye pattern. In this way, the time locations of two plot data adjacent to the feature point are uniquely determined, and thus, the time locations are specified.

Subsequently, in step S301a, the eye pattern evaluating unit 15 reads the plot data of the start cycles (plot data of two clock cycles) from the plot data file 13, and extracts a plot data part to be processed from the read plot data depending on whether the mask voltage of the feature point is positive or negative.

Since the mask voltages of the feature points point r and point s illustrated in FIG. 19 are positive voltages, the eye pattern evaluating unit 15 extracts plot data parts having positive voltage values as processing objects, as illustrated in FIG. 12A. On the other hand, since the mask voltages of the feature points point t and point u illustrated in FIG. 19 are negative voltages, the eye pattern evaluating unit 15 extracts plot data parts having negative voltage values as processing objects, as illustrated in FIG. 12B.

As can be seen from FIG. 18, there is a case that the plot data is not exist which is to be extracted in step S301a as a processing object. In that case, the eye pattern evaluating unit 15 reads the plot data of the next cycles (plot data of two clock cycles).

Subsequently, in step S302a, the eye pattern evaluating unit 15 sets the plot data parts extracted in step S301a as processing objects, extracts two continuous plot data at the time locations specified in S300a included in the plot data parts. The eye pattern evaluating unit 15 works out a linear interpolation formula, which is obtained by the two continuous plot data. And then, the eye pattern evaluating unit 15 calculates the intersection point between the linear interpolation formula and the time location of the feature point, in other words, calculates the voltage value of the intersection point.

Subsequently, in step S303a, the eye pattern evaluating unit 15 calculates a difference voltage value between the mask voltage of the feature point and the voltage value of the calculated intersection point, and substitutes the difference voltage value for a variable "minimum difference voltage value". In the above calculation of the difference voltage value, the eye pattern evaluating unit 15 sets a negative sign to the difference voltage value to be calculated when the voltage value of the calculated intersection point enters into the eye pattern, sets a positive sign to the difference voltage value to be calculated when the voltage value of the calculated intersection point does not enter into the eye pattern.

Subsequently, in step S304a, the eye pattern evaluating unit 15 determines whether up to the plot data of the final cycles (plot data of two clock cycles) stored in the plot data file 13 is processed. When it is determined that up to the plot data of the final cycles is not processed, the eye pattern evaluating unit 15 proceeds to step S305a. In other words, the eye pattern evaluating unit 15 reads plot data of the next cycles (plot data of two clock cycles) from the plot data file 13, and extracts plot data parts to be processed from the read plot data depending on whether the mask voltages of the features points are positive or negative, according to a processing equivalent to the processing of step S301a.

As can be seen from FIG. 18, there is a case that the plot data is not exist which is to be extracted in step S305a as a processing object. In that case, the eye pattern evaluating unit 15 reads the plot data of the next cycles (plot data of two clock cycles).

Subsequently, in step S306a, the eye pattern evaluating unit 15 sets the plot data parts extracted in step S305a as processing objects, and extracts two continuous plot data at the time locations specified in S300a included in the plot data parts. The eye pattern evaluating unit 15 works out a linear interpolation formula, which is obtained by the two continuous plot data. And, the eye pattern evaluating unit 15 calculates the intersection point between the linear interpolation formula and the time location of the feature point, in other words, calculates the voltage value of the intersection point.

Subsequently, in step S307a, the eye pattern evaluating unit 15 calculates a difference voltage value between the mask voltage of the feature point and the voltage value of the calculated intersection point. In the above calculation of the difference voltage value, the eye pattern evaluating unit 15 sets a negative sign to the difference voltage value to be calculated when the voltage value of the calculated intersection point enters into the eye pattern, sets a positive sign to the difference voltage value to be calculated when the voltage value of the calculated intersection point does not enter into the eye pattern.

Subsequently, in step S308a, the eye pattern evaluating unit 15 determines whether the calculated difference voltage value is smaller than the value of the variable "minimum difference voltage value". And then, in step S309a, the eye pattern evaluating unit 15 determines whether a determination result "smaller" is obtained. In this case, the eye pattern evaluating unit 15 executes in the determination processing that a difference voltage value with a negative sign is smaller than a difference voltage value with a positive sign, and that a difference voltage value with a larger absolute value is smaller when both difference voltage values have negative signs, according to a normal mathematical logic.

When it is determined that the calculated difference voltage value is smaller than the value of the variable "minimum difference voltage value" according to the determination processing, the eye pattern evaluating unit 15 proceeds to step S310a. In other words, the eye pattern evaluating unit 15 rewrites the value of the variable "minimum difference voltage value" in accordance with the calculated difference voltage value, and then returns to the processing of step S304a.

On the other hand, when it is determined that the calculated difference voltage value is larger than the value of the variable "minimum difference voltage value" according to the determination processing, the eye pattern evaluating unit 15 immediately returns to the processing of step S304a without executing the processing of step S310a.

In this way, when it is determined that up to the plot data of the final cycles stored in the plot data file 13 is processed in step S304a after repetitions of the processing of steps S304a to S310a, the eye pattern evaluating unit 15 proceeds to step S311a. In other words, the eye pattern evaluating unit 15 determines the value of the variable "minimum difference voltage value" as the voltage axis margin of the processed feature point.

When there is a plurality of feature points not on the time axis, the eye pattern evaluating unit 15 executes the processing of the flow chart of FIG. 16 to the feature points to thereby calculate the margins in the voltage axis direction of the feature points.

Based on the calculated margins in the voltage axis direction of the feature points, the eye pattern evaluating unit 15, for example, specifies the minimum margin among the margins, and determines the minimum margin as the margin in the voltage axis direction.

[2-4] Calculation Processing of Time Axis Margin

To calculate the time axis margin in accordance with the flow chart of FIG. 17, the eye pattern evaluating unit 15 proceeds to step S40 of the flow chart of FIG. 4. In other words, the eye pattern evaluating unit 15 selects one of the feature points on the time axis, and enters into the calculation processing of the time axis margin concerning the feature point. And, the eye pattern evaluating unit 15 first reads the plot data of the start cycles (plot data of two clock cycles) from the plot data file 13 in step S400a, and extracts a plot data part to be processed according to the time location of the feature point from the read plot data.

Since the time location of the feature point p illustrated in FIG. 19 is temporally before the center location of the eye pattern, the eye pattern evaluating unit 15 extracts a plot data part that is temporally before the center location of the eye pattern as a processing object, as illustrated in FIG. 13A. On the other hand, since the time location of the feature point q illustrated in FIG. 19 is temporally after the center location of the eye pattern, the eye pattern evaluating unit 15 extracts a plot data part that is temporally after the center location of the eye pattern as a processing object, as illustrated in FIG. 13B.

As can be seen from FIG. 18, there is a case that the plot data is not exist which is to be extracted in step S400a as a processing object. In that case, the eye pattern evaluating unit 15 reads the plot data of the next cycles (plot data of two clock cycles).

Subsequently, in step S401a, the eye pattern evaluating unit 15 sets the plot data parts extracted in step S400a as processing objects, and extracts two continuous plot data crossing 0 V (time axis) from the extracted plot data part. The eye pattern evaluating unit 15 works out a linear interpolation formula, which is obtained by the two continuous plot data. And, the eye pattern evaluating unit 15 calculates the intersection point between the linear interpolation formula and the time axis, in other words, calculates the time value of the intersection point.

Subsequently, in step S402a, the eye pattern evaluating unit 15 calculates a difference time value between the time value of the feature point and the time value of the calculated intersection point, and substitutes the difference time value for the variable "minimum difference time value". In the above calculation of the difference time value, the eye pattern evaluating unit 15 sets a negative sign to the difference time value to be calculated when the time value of the calculated intersection point enters into the eye pattern, sets a positive sign to the difference time value to be calculated when the time value of the calculated intersection point does not enter into the eye pattern.

Subsequently, in step S403a, the eye pattern evaluating unit 15 determines whether up to the plot data of the final cycles (plot data of two clock cycles) stored in the plot data file 13 is processed. When it is determined that up to the plot data of the final cycles is not processed, the eye pattern evaluating unit 15 proceeds to step S404a. In other words, the eye pattern evaluating unit 15 reads plot data of the next cycles (plot data of two clock cycles) from the plot data file 13, and extracts plot data parts to be processed in accordance with the time location of the feature points from the read plot data, according to a processing equivalent to the processing of step S400a.

As can be seen from FIG. 18, there is a case that the plot data is not exist which is to be extracted in step S404a as a processing object. In that case, the eye pattern evaluating unit 15 reads the plot data of the next cycles (plot data of two clock cycles).

Subsequently, in step S405a, the eye pattern evaluating unit 15 sets the plot data parts extracted in step S400a as processing objects, and extracts two continuous plot data crossing 0 V (time axis) from the extracted plot data part. The eye pattern evaluating unit 15 works out a linear interpolation formula, which is obtained by the two continuous plot data. And, the eye pattern evaluating unit 15 calculates the intersection point between the linear interpolation formula and the time axis, in other words, calculates the time value of the intersection point.

Subsequently, in step S406a, the eye pattern evaluating unit 15 calculates a difference time value between the time value of the feature point and the time value of the calculated intersection point. In the above calculation of the difference time value, the eye pattern evaluating unit 15 sets a negative sign to the difference time value to be calculated when the time value of the calculated intersection point enters into the eye pattern, sets a positive sign to the difference time value to be calculated when the time value of the calculated intersection point does not enter into the eye pattern.

Subsequently, in step S407a, the eye pattern evaluating unit 15 determines whether the calculated difference time value is smaller than the value of the variable "minimum difference time value". And then, in step S408a, the eye pattern evaluating unit 15 determines whether a determination result "smaller" is obtained. In this case, the eye pattern evaluating unit 15 executes in the determination processing that a difference time value with a negative sign is smaller than a difference time value with a positive sign, and that a difference time value with a larger absolute value is smaller when both difference time values have negative signs, according to a normal mathematical logic.

When it is determined that the calculated difference time value is smaller than the value of the variable "minimum difference time value" according to the determination processing, the eye pattern evaluating unit 15 proceeds to step S409a. In other words, the eye pattern evaluating unit 15 rewrites the value of the variable "minimum difference time value" in accordance with the calculated difference time value, and then returns to the processing of step S403a.

On the other hand, when it is determined that the calculated difference time value is larger than the value of the variable "minimum difference time value" according to the determination processing, the eye pattern evaluating unit 15 immediately returns to the processing of step S403a without executing the processing of step S409a.

In this way, the processing of steps S403a to S409a are repeated. And, when it is determined that up to the plot data of the final cycles stored in the plot data file 13 is processed in step S403a, the eye pattern evaluating unit 15 proceeds to step S410a. In other words, the eye pattern evaluating unit 15 determines the value of the variable "minimum difference time value" as the time axis margin of the processed feature point.

When there are a plurality of feature points on the time axis, the eye pattern evaluating unit 15 executes the processing of the flow chart of FIG. 17 to the feature points to thereby calculate the margins in the time axis direction of the feature points.

Based on the calculated margins in the time axis direction of the feature points, the eye pattern evaluating unit 15, for example, specifies the minimum margin among the margins, and determines the minimum margin as the margin in the time axis direction.

In this way, in the execution of the flow charts of FIGS. 14 to 17, the eye pattern evaluating unit 15 estimates time values and voltage values of the plot data at feature point locations according to the linear interpolation method, and, based on the estimation, executes the calculation processing of the eye pattern center, the calculation processing of the voltage axis margin, and the calculation processing of the time axis margin. As a result, the margin included in the eye pattern generated by the simulator relative to the mask can be calculated with high accuracy.

In the calculation processing of eye margin described with reference to FIGS. 1 to 19, the center location of the mask (see FIG. 19) presented from the maker that provides the receiving device is arranged at the center location of the eye pattern to calculate the margin between the eye pattern and the mask. In other words, the center location of the mask in the voltage axis direction is fixed to a zero value, and the center location of the mask in the time axis direction is fixed to the location of the center of one cycle of the eye pattern. Such a calculation processing of eye margin corresponds to functions of a clock data recovery circuit and a difference input buffer of a general receiving device.

However, the mask specifying method is not uniform in the industry, and for example, a maker requests that the margin calculated by moving, without fixing, the arrangement location of the mask satisfies specifications of the receiving device.

In the method of calculating the margin by arranging the center location of the mask at the center location of the eye pattern as described above, when the calculated margin does not satisfy the specifications of the receiving device, it is needed to obtain a margin satisfying the specifications of the receiving device by changing the design of the transmission path, in other words, by using high-priced element components for the transmission path.

When the margin is calculated while moving the arrangement location of the mask without fixing the arrangement location of the mask, and the margin at the arrangement location with maximum calculated margin can be provided to the user, the acquisition of excessive margins can be prevented. As a result, there is an increased possibility that lower-priced element components can be used for the transmission path, and a cost-reduced design can be attained. Another embodiment of the eye pattern evaluating apparatus described below allows calculation of the margin while moving the arrangement location of the mask.

Figure 20:
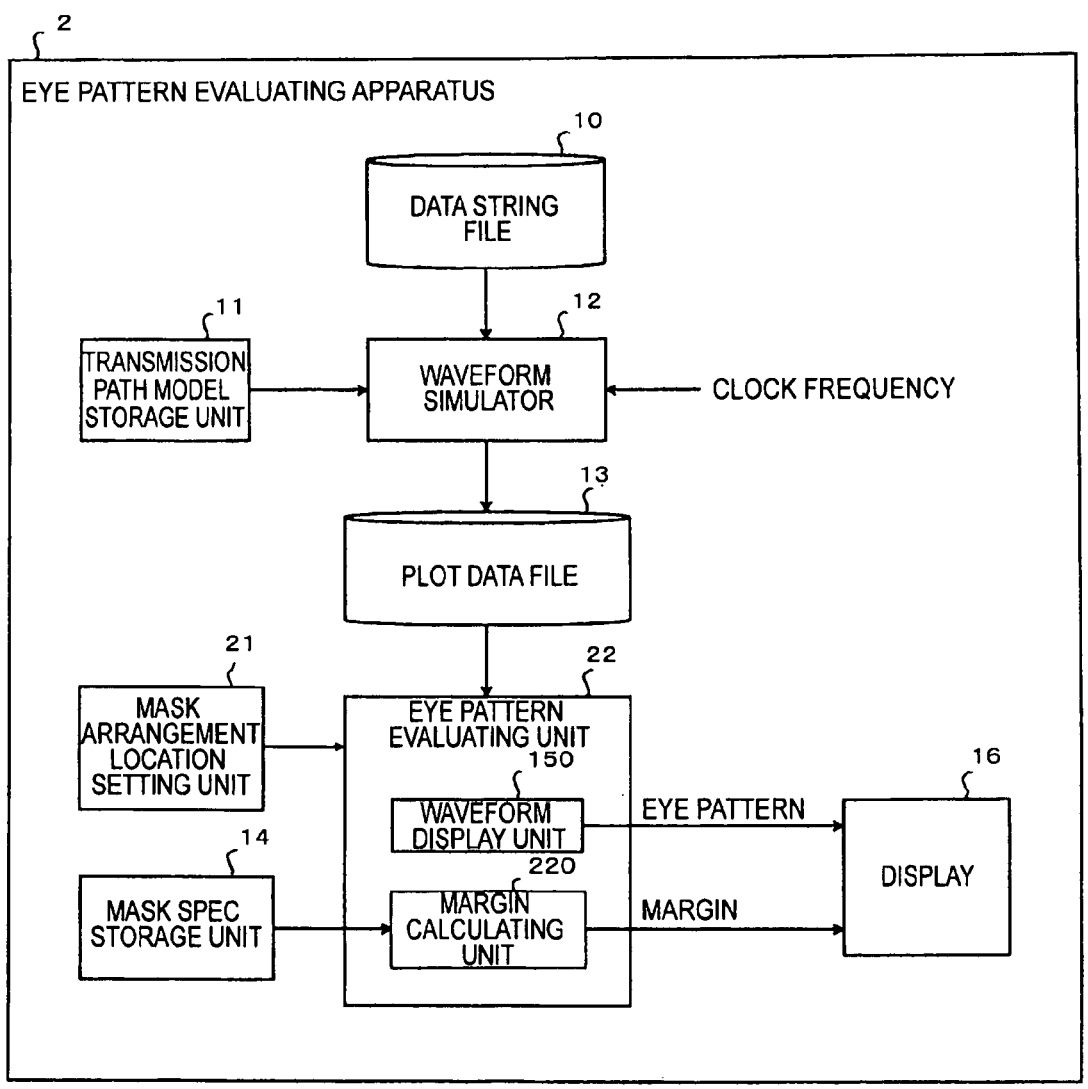
FIG. 20 is a diagram illustrating an eye pattern evaluating apparatus of another embodiment.

FIG. 20 is a diagram illustrating an eye pattern evaluating apparatus of another embodiment. An eye pattern evaluating apparatus 2 illustrated in FIG. 20 includes the data string file 10, the transmission path model storage unit 11, the waveform simulator 12, the plot data file 13, the mask spec storage unit 14, the display 16, a mask arrangement location setting unit 21, and an eye pattern evaluating unit 22. The eye pattern evaluating unit 22 includes the waveform display unit 150 and a margin calculating unit 220. The constituent elements of the eye pattern evaluating apparatus 2 illustrated in FIG. 20 designated with the same reference numerals as the constituent elements of the eye pattern evaluating apparatus 1 described with reference to FIG. 1 are the same as the constituent elements of the eye pattern evaluating apparatus 1.

The mask arrangement location setting unit 21 sets a mode related to the arrangement location of (the center of) the mask according to the designation and input by the user. Specifically, the mask arrangement location setting unit 21 displays a mask arrangement location setting screen described below with reference to FIG. 21 on the display 16, and sets a mode related to the arrangement location of the mask according to the selection and operation by the user on the mask arrangement location setting screen. In other words, the mask arrangement location setting unit 21 sets a mode (first mode) with the arrangement location of the mask at the center location of the eye pattern, or sets a mode without limit in the arrangement location of the mask. The mode without limit in the arrangement location of the mask is, for example, a mode (second mode) without limit in the arrangement location of the time axis direction (direction along the time axis) of the mask although the arrangement location (center location in the voltage axis direction of the mask) in the voltage axis direction (direction along the voltage axis) of the mask is fixed to a zero value, a mode (third mode) without limit in the arrangement location in the voltage axis direction of the mask although the arrangement location in the time axis direction of the mask (center location in the time axis direction of the mask) is fixed to the center location of one cycle of the eye pattern, or a mode (fourth mode) without limit in the arrangement location in the time axis direction and the arrangement location in the voltage axis direction of the mask. The center location in the voltage axis direction of the mask is, for example, a location in the voltage axis direction of a point on the mask corresponding to a voltage coordinate value obtained by adding the maximum voltage coordinate value and the minimum voltage coordinate value on the mask and dividing by "2". The center location in the time axis direction of the mask is, for example, a location in the time axis direction on the mask corresponding to a time coordinate value obtained by adding the maximum time coordinate value and the minimum time coordinate value on the mask and dividing by "2".

The eye pattern evaluating unit 22 generates an eye pattern, displays the eye pattern on the display 16, calculates the margin included in the eye pattern generated by the waveform display unit 150 relative to the mask stored in the mask spec storage unit 14, and displays the calculation result on the display 16. In the same way as the waveform display unit 150 described with reference to FIG. 1, the waveform display unit 150 included in the eye pattern evaluating unit 22 sequentially cuts out waveform signal pieces with a length of two clock cycles from the plot data stored in the plot data file 13, and superimposes and displays the waveform signal pieces on the display 16. As a result, the waveform display unit 150 generates the eye pattern as illustrated in FIG. 18 described above and display the eye pattern on the display 16.

When the mask arrangement location setting unit 21 sets the first mode as a mode related to the arrangement location of the mask, the margin calculating unit 220 calculates voltage axis margins of the feature points of the mask (differences between the voltage coordinate values of the feature points and the voltage coordinate values of the waveform signal piece parts associated with the feature points), in accordance with the flow chart illustrated in FIG. 7 or 16 described above, for example. And, based on the calculation, the margin calculating unit 220 calculates and outputs the final voltage axis margin. The margin calculating unit 220 also calculates time axis margins of the feature points of the mask (differences between the time coordinate values of the feature points and the time coordinate values of the waveform signal piece parts associated with the feature points), in accordance with the flow chart illustrated in FIG. 8 or 17 described above, for example. And, based on the calculation, the margin calculating unit 220 calculates and outputs the final time axis margin.

When the mask arrangement location setting unit 21 sets a mode without limit in the arrangement location of the mask as a mode related to the arrangement location of the mask, the margin calculating unit 220 calculates the margin included in the eye pattern generated by the waveform display unit 150 relative to the mask stored in the mask spec storage unit 14, while moving the arrangement location of the mask. And the margin calculating unit 220 displays the calculation result on the display 16. Specifically, when the mask arrangement location setting unit 21 sets the second mode as a mode related to the arrangement location of the mask, the margin calculating unit 220 moves the arrangement location in the time axis direction of the mask step by step (predetermined time) along the time axis while fixing the arrangement location in the voltage axis direction of the mask to a zero value. For example, the margin calculating unit 220 initializes the arrangement location in the time axis direction of the mask to the location where part of the mask starts to enter the opening of the eye pattern. And then, the margin calculating unit 220 moves the arrangement location in the time axis direction of the mask from the initialized arrangement location to an arrangement location where the mask starts to exit the eye pattern.

The margin calculating unit 220 calculates time axis margins of the feature points of the mask at the arrangement locations of the destinations (differences between the time coordinate values of the feature points and the time coordinate values of the waveform signal piece parts associated with the feature points). The margin calculating unit 220 selects the arrangement location of the mask where the time axis margin of the feature point with minimum time axis margin is the largest as a selection arrangement location. The margin calculating unit 220 calculates the final time axis margin and the final voltage axis margin at the selected selection arrangement location and outputs the calculation result to the display 16. The margin calculating unit 220 sets the minimum time axis margin among the time axis margins of the feature points at the selection arrangement location as a final time axis margin. The margin calculating unit 220 also sets the minimum voltage axis margin among the voltage axis margins of the feature points at the selection arrangement location as a final voltage axis margin.

When the mask arrangement location setting unit 21 sets the third mode as a mode related to the arrangement location of the mask, the margin calculating unit 220 moves the arrangement location in the voltage axis direction of the mask by predetermined steps (predetermined voltage values) along the voltage axis while fixing the arrangement location in the time axis direction of the mask at the center location of one cycle of the eye pattern. For example, the margin calculating unit 220 initializes the arrangement location in the voltage axis direction of the mask to the location where part of the mask starts to enter the opening of the eye pattern. And then, the margin calculating unit 220 moves the arrangement location in the voltage axis direction of the mask from the initialized arrangement location to the arrangement location where the mask starts to exit the eye pattern. The margin calculating unit 220 calculates voltage axis margins of the feature points of the mask at the arrangement locations of the destinations (differences between the voltage coordinate values of the feature points and the voltage coordinate values of the waveform signal piece parts associated with the feature points). The margin calculating unit 220 selects the arrangement location of the mask where the voltage axis margin of the feature point with minimum voltage axis margin is the largest as a selection arrangement location. The margin calculating unit 220 then calculates the final time axis margin and the final voltage axis margin at the selected arrangement location of the mask and outputs the calculation result to the display 16.

When the mask arrangement location setting unit 21 sets the fourth mode as a mode related to the arrangement location of the mask, the margin calculating unit 220 moves the arrangement location of the mask by predetermined steps along the voltage axis and the time axis. The margin calculating unit 220 moves the arrangement location in the voltage axis direction of the mask by an amount of a predetermined voltage value when moving the arrangement location of the mask along the voltage axis. And then, the margin calculating unit 220 moves the arrangement location in the time axis direction of the mask by an amount of a predetermined time when moving the arrangement location of the mask along the time axis. For example, the margin calculating unit 220 moves the arrangement location of the mask until the mask passes through all areas in the opening of the eye pattern. The movement route of the arrangement location of the mask can be a predetermined arbitrary route. The margin calculating unit 220 then calculates a square sum of the voltage axis margins and the time axis margins of the feature points of the mask at the arrangement locations of destinations. The margin calculating unit 220 selects the arrangement location of the mask where the square sum corresponding to the feature point with minimum square sum is the largest as a selection arrangement location. The margin calculating unit 220 then calculates the final time axis margin and the final voltage axis margin at the selected selection arrangement location of the mask and outputs the calculation result to the display 16.

Figure 21:
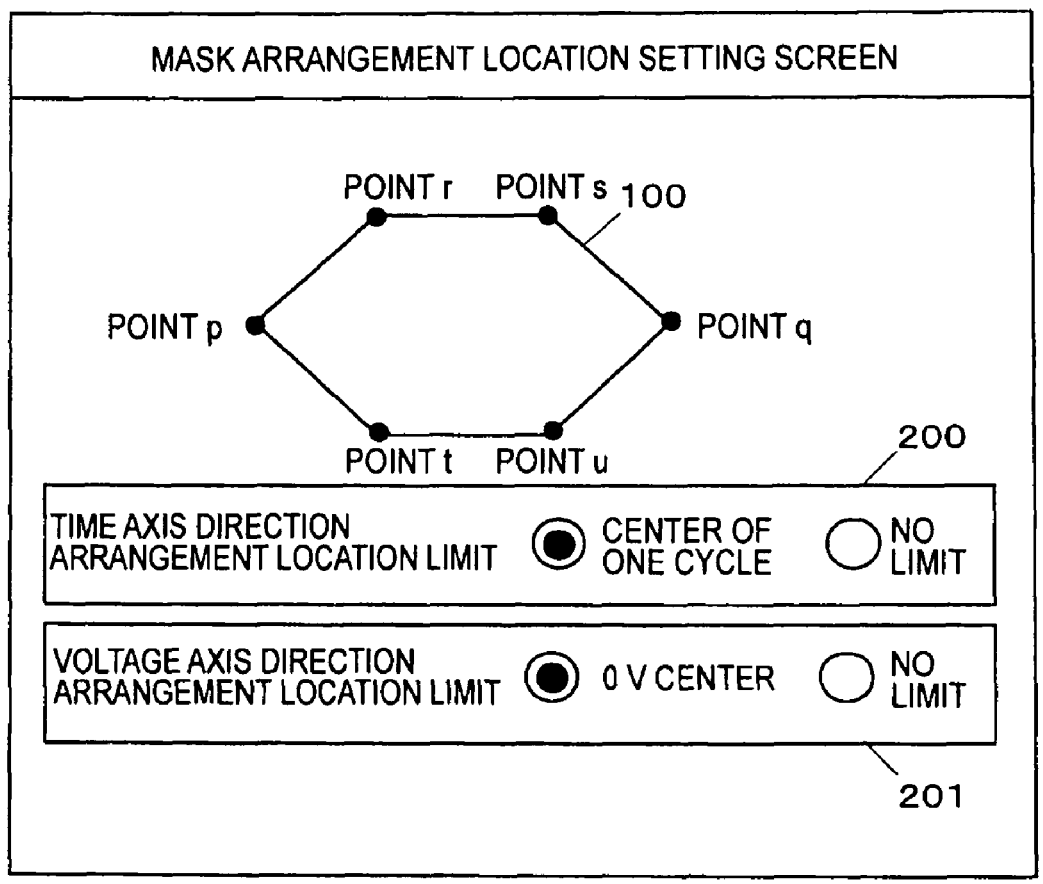
FIG. 21 is a diagram illustrating an example of a mask arrangement location setting screen.

FIG. 21 is a diagram illustrating an example of the mask arrangement location setting screen. The mask arrangement location setting screen illustrated in 21 displays a mask 100, an area (time axis direction arrangement location limit setting area) 200 for setting whether to set limit to the arrangement location in the time axis direction of the mask, and an area (voltage axis direction arrangement location limit setting area) 201 for setting whether to set limit to the arrangement location in the voltage axis direction of the mask. On the mask 100 in FIG. 21, point r, point s, point p, point q, point t, and point u are feature points of the mask 100. When the user selects "CENTER OF ONE CYCLE" described in the time axis direction arrangement location limit setting area 200, the arrangement location in the time axis direction of the mask is set to be fixed at the center location of one cycle of the eye pattern. And, when the user selects "NO LIMIT", no limit is set to the arrangement location in the time axis direction of the mask. When the user selects "0 V CENTER" described in the voltage axis direction arrangement location limit setting area 201, the arrangement location in the voltage axis direction is set to be fixed to a zero value (0 V). And, when the user selects "NO LIMIT", no limit is set to the arrangement location in the voltage axis direction of the mask.

More specifically, when the user selects "CENTER OF ONE CYCLE" described in the time axis direction arrangement location limit setting area 200 and "0 V CENTER" described in the voltage axis direction arrangement location limit setting area 201, the mask arrangement location setting unit 21 sets the mode related to the arrangement location of the mask to the first mode. When the user selects "NO LIMIT" described in the time axis direction arrangement location limit setting area 200 and "0 V CENTER" described in the voltage axis direction arrangement location limit setting area 201, the mask arrangement location setting unit 21 sets the mode related to the arrangement location of the mask to the second mode. When the user selects "CENTER OF ONE CYCLE" described in the time axis direction arrangement location limit setting area 200 and "NO LIMIT" described in the voltage axis direction arrangement location limit setting area 201, the mask arrangement location setting unit 21 sets the mode related to the arrangement location of the mask to the third mode. When the user selects "NO LIMIT" described in the time axis direction arrangement location limit setting area 200 and "NO LIMIT" described in the voltage axis direction arrangement location limit setting area 201, the mask arrangement location setting unit 21 sets the mode related to the arrangement location of the mask to the fourth mode.

Figure 22:
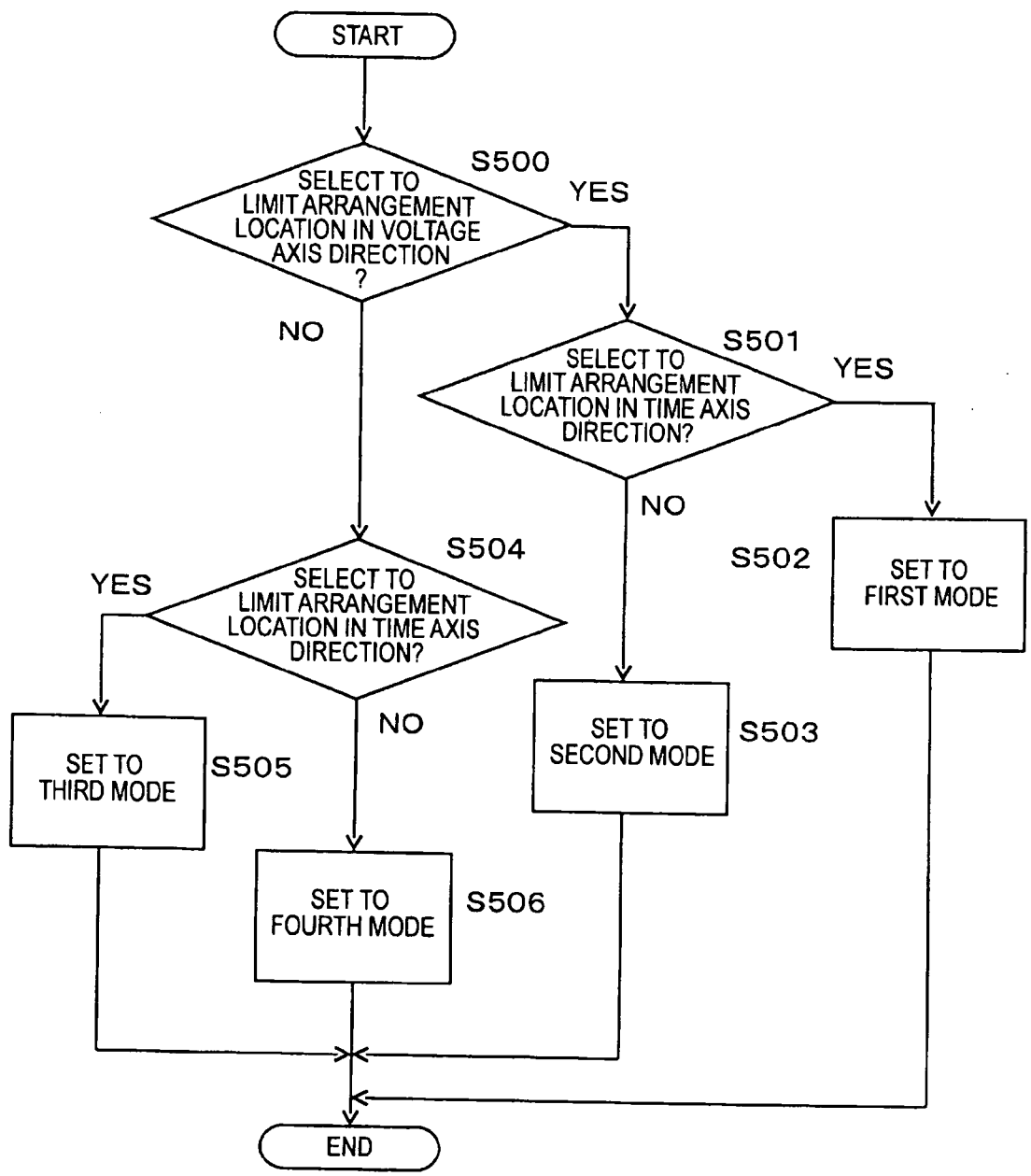
FIG. 22 is a diagram illustrating an example of a flow chart of a setting processing of a mode related to an arrange location of the mask.

FIG. 22 is a diagram illustrating an example of a flow chart of the setting processing of the mode related to the arrangement location of the mask. The mask arrangement location setting unit 21 determines whether a selection is made to set limit to the arrangement location in the voltage axis direction and the arrangement location in the time axis direction of the mask according to the selection and operation of the user on the mask arrangement location setting screen illustrated in FIG. 21. And the mask arrangement location setting unit 21 sets the mode related to the arrangement location of the mask to the mode corresponding to the determination result. The mask arrangement location setting unit 21 first determines whether a selection is made to set limit to the arrangement location in the voltage axis direction of the mask (whether "0 V CENTER" described in the voltage axis direction arrangement location limit setting area 201 in FIG. 21 is selected) (step S500). When the mask arrangement location setting unit 21 determines that a selection is not made to set limit to the arrangement location in the voltage axis direction of the mask, the processing proceeds to step S504. When the mask arrangement location setting unit 21 determines that a selection is made to set limit to the arrangement location in the voltage axis direction of the mask, the mask arrangement location setting unit 21 determines whether a selection is made to set limit to the arrangement location in the time axis direction of the mask (whether "CENTER OF ONE CYCLE" described in the time axis direction arrangement location limit setting area 200 is selected) (step S501). When the mask arrangement location setting unit 21 determines that a selection is made to set limit to the arrangement location in the time axis direction of the mask, the mask arrangement location setting unit 21 sets the mode related to the arrangement location of the mask to the first mode (step S502). When the mask arrangement location setting unit 21 determines that a selection is not made to set limit to the arrangement location in the time axis direction of the mask, the mask arrangement location setting unit 21 sets the mode related to the arrangement location of the mask to the second mode (step S503).

In step S504, the mask arrangement location setting unit 21 determines whether a selection is made to set limit to the arrangement location in the time axis direction of the mask (step S504). When the mask arrangement location setting unit 21 determines that a selection is made to set limit to the arrangement location in the time axis direction of the mask, the mask arrangement location setting unit 21 sets the mode related to the arrangement location of the mask to the third mode (step S505). When the mask arrangement location setting unit 21 determines that a selection is not made to set limit to the arrangement location in the time axis direction of the mask, the mask arrangement location setting unit 21 sets the mode related to the arrangement location of the mask to the fourth mode (step S506).

Hereinafter, margin calculation processing corresponding to the modes set for the arrangement location of the mask will be described. When the mask arrangement location setting unit 21 sets the mode related to the arrangement location of the mask to the first mode, the margin calculating unit 220 executes a margin calculation processing in accordance with the flow chart illustrated in FIG. 16 or the flow chart illustrated in FIG. 8 or 17. And, the margin calculating unit 220 calculates and outputs the final margin based on the execution result. Therefore, the description of the margin calculation processing when the mask arrangement location setting unit 21 set the mode related to the arrangement location to the first mode is omitted.

Figure 23:
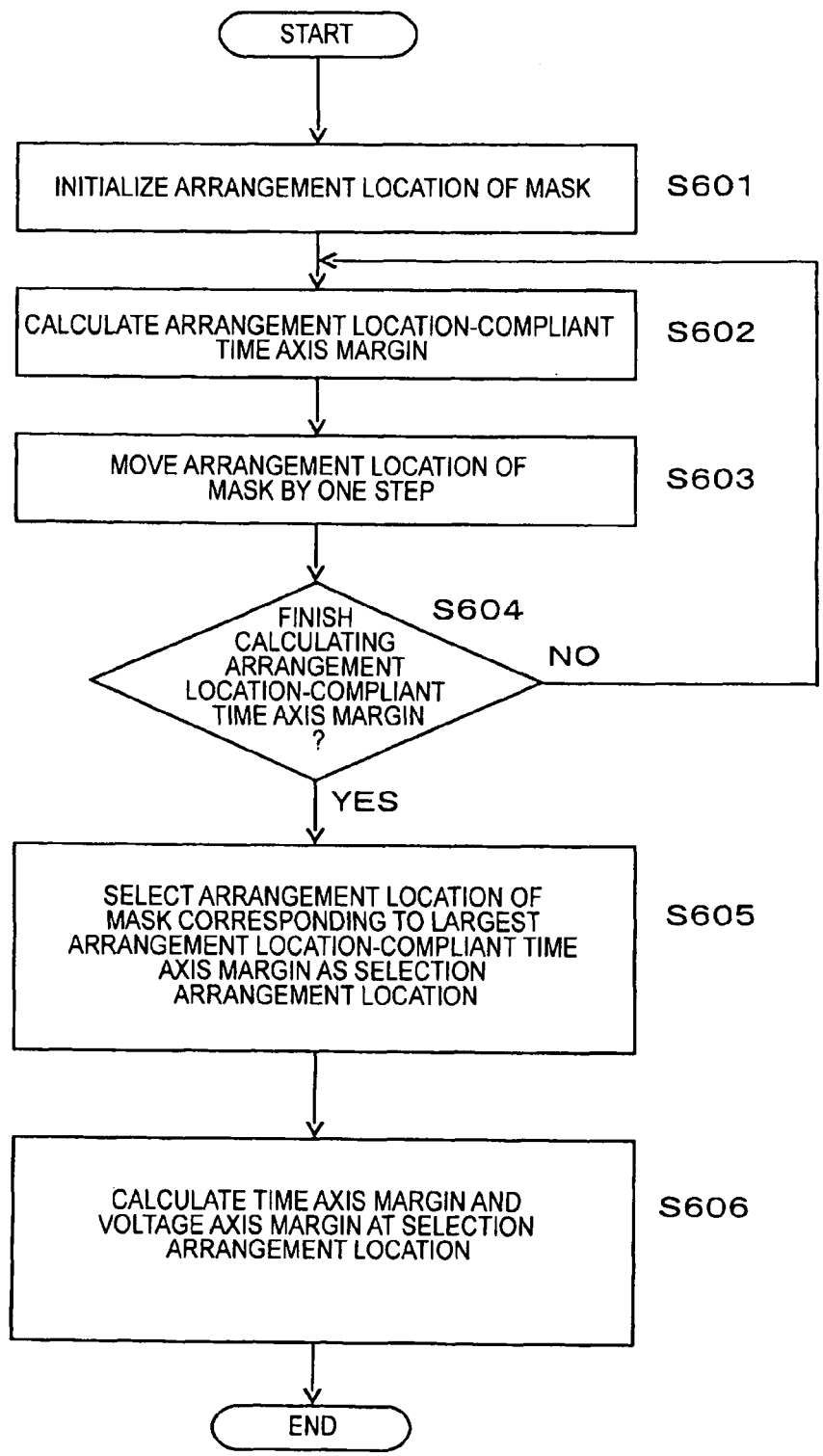
FIG. 23 is a diagram illustrating an example of a flow chart of a margin calculation processing.

FIG. 23 is a diagram illustrating an example of a flow chart of the margin calculation processing by the margin calculating unit when the second mode is set for the arrangement location of the mask. For example, when the arrangement location of the mask is such an arrangement location that the mask does not fall within the opening of the eye pattern, the margin calculating unit 220 does not execute the calculation processing of an arrangement location-compliant time axis margin in step S602 described below.

Figure 24:
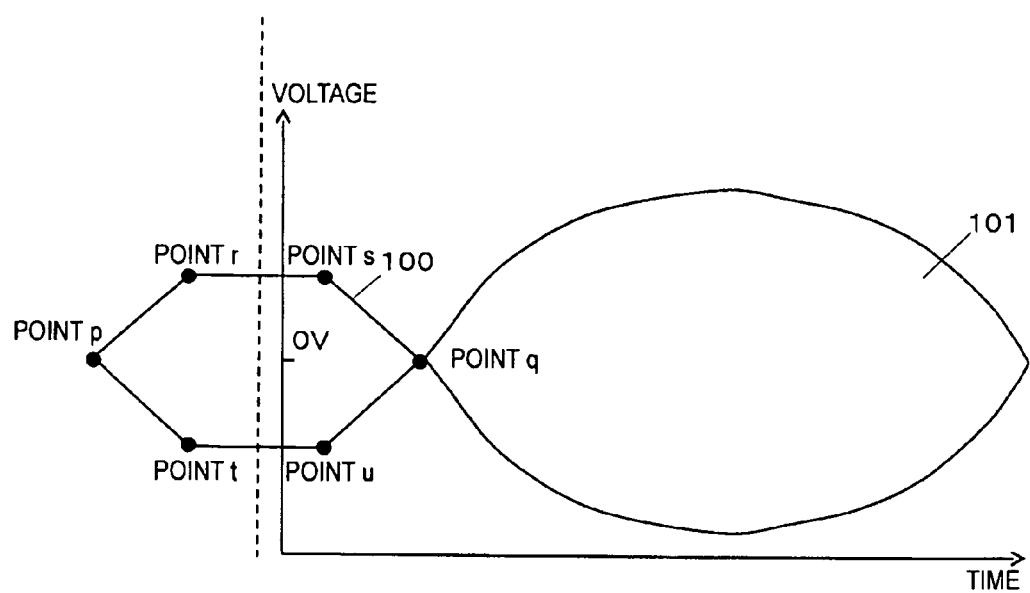
FIG. 24 is a diagram for explaining an example of initializing the arrangement location of the mask.

The margin calculating unit 220 first initializes the arrangement location of the mask (step S601). Specifically, as illustrated in FIG. 24, the margin calculating unit 220 sets the center location in the voltage axis direction of the mask 100 (location in the voltage axis direction of the feature point p and the feature point q) to a zero value (0 V). Further, the margin calculating unit 220 arranges the center location in the time axis direction of the mask 100 (location in the time axis direction of the point on the mask corresponding to the time coordinate value obtained by adding the time coordinate value of the point p and the time coordinate value of the point q and dividing by two) at the location where part of the mask 100 starts to enter the opening of the eye pattern. The time coordinate value of the dotted line part in FIG. 24 illustrates the center location in the time axis direction of the mask 100. In the example, the mask 100 is moved to the right in step S603 as described below with reference to FIG. 26.

The margin calculating unit 220 calculates the time axis margin corresponding to the current arrangement location of the mask (arrangement location-compliant time axis margin) (step S602). Specifically, the margin calculating unit 220 calculates the time axis margins of the feature points of the mask at the current arrangement location (differences between the time coordinate values of the feature points and the time coordinate values of the waveform signal piece parts associated with the feature points). And, the margin calculating unit 220 sets the time axis margin of the feature point where the calculated time axis margin is the smallest as the arrangement location-compliant time axis margin.

Figure 25:
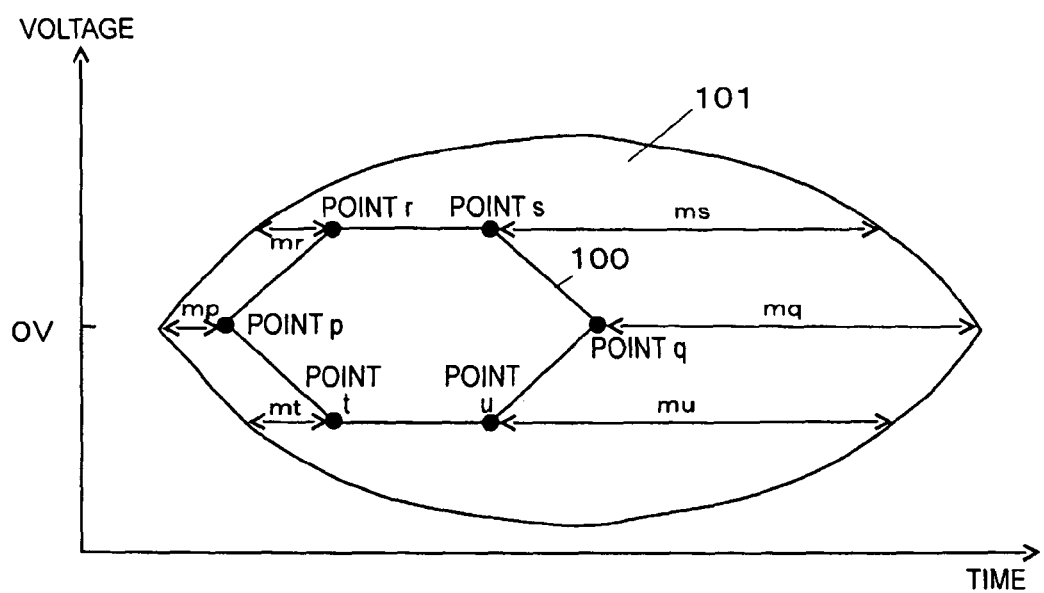
FIG. 25 is a diagram for explaining an example of calculating an arrangement location-compliant time axis margin.

For example, it is assumed that the current arrangement location of the mask is at the arrangement location as illustrated in FIG. 25. The margin calculating unit 220 calculates a time axis margin mr of the point r, a time axis margin ms of the point s, a time axis margin mp of the point p, a time axis margin mq of the point q, a time axis margin mt of the point t, and a time axis margin mu of the point u. The margin calculating unit 220, for example, executes a processing similar to the determination processing of the time axis margin of feature point described with reference to the flow chart illustrated in FIG. 8, in other words, calculates mp and mq. Furthermore, the margin calculating unit 220 specifies, for the plot data of each cycle, for example, the time coordinate value of the waveform signal piece part where the voltage coordinate value is closest to the voltage coordinate value of the point r. And then, the margin calculating unit 220 calculates the difference between the specified time coordinate value and the time coordinate value of the point r, and calculates the minimum value among the calculated differences as mr. The margin calculating unit 220 calculates ms, mt, and mu using a method similar to the calculation method of mr. Among the calculated mr, ms, mp, mt, and mu, the margin calculating unit 220 sets mp with the smallest value as the time axis margin corresponding to the current arrangement location of the mask (arrangement location-compliant time axis margin).

The margin calculating unit 220 may calculate the time axis margins only for the point p and the point q where the voltage axis coordinate is at the center location in the voltage direction of the mask and set the time axis margin with a smaller value as the arrangement location-compliant time axis margin.

Figure 26:
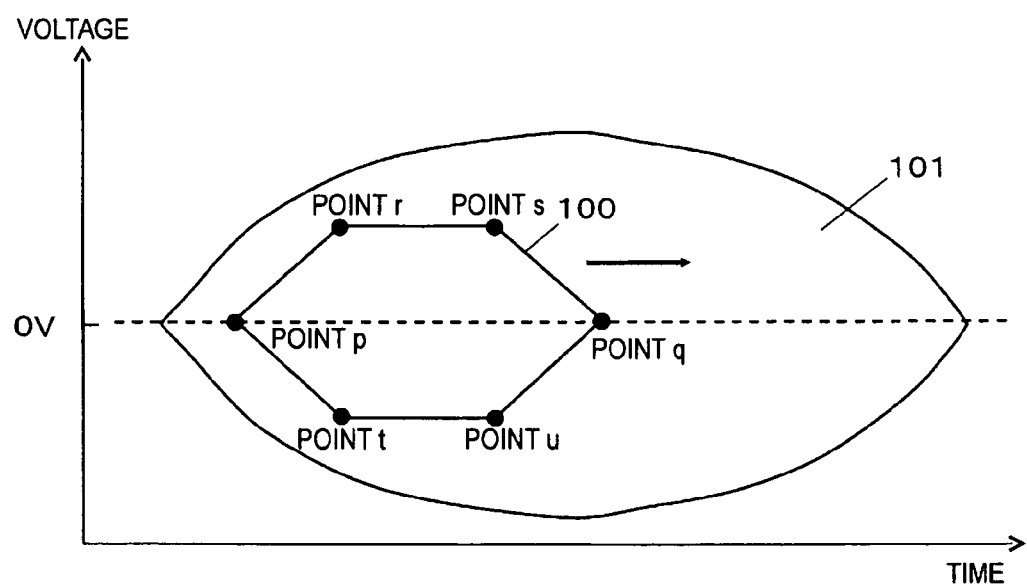
FIG. 26 is a diagram for explaining the movement of the arrangement location of the mask.

Next, the margin calculating unit 220 moves the arrangement location of the mask one step in the time axis direction (step S603). FIG. 26 is a diagram for explaining the movement of the arrangement location of the mask. While fixing the center location in the voltage axis direction of the mask 100 (location in the voltage axis direction of the feature point p and the feature point q) to 0 V, the margin calculating unit 220 moves the mask 100 step by step along the route illustrated with a dotted line in FIG. 26 until the mask 100 starts to exit from the opening 101 of the eye pattern, for example, in the direction of the arrow illustrated in FIG. 26 (to the right).

The margin calculating unit 220 determines whether to finish calculating the arrangement location-compliant time axis margin (step S604). Specifically, the margin calculating unit 220 determines whether the arrangement location of the mask is at the arrangement location where the mask starts to exit from the opening of the eye pattern. When the arrangement location of the mask is at the arrangement location where the mask starts to exit from the opening of the eye pattern, the margin calculating unit 220 determines to finish calculating the arrangement location-compliant time axis margin.

When the arrangement location of the mask is not at the arrangement location where the mask starts to exit from the opening of the eye pattern, the margin calculating unit 220 determines not to finish calculating the arrangement location-compliant time axis margin.

When the margin calculating unit 220 determines not to finish calculating the arrangement location-compliant time axis margin, the processing returns to step S602. When the margin calculating unit 220 determines to finish calculating the arrangement location-compliant time axis margin, the margin calculating unit 220 selects the arrangement location of the mask corresponding to the largest arrangement location-compliant time axis margin among the calculated arrangement location-compliant time axis margins as a selection arrangement location (step S605). The margin calculating unit 220 then calculates the time axis margin and the voltage axis margin at the selection arrangement location (step S606). Specifically, the margin calculating unit 220 calculates the minimum time axis margin among the time axis margins of the feature points at the selection arrangement location as the time axis margin at the selection arrangement location. The margin calculating unit 220 also calculates the minimum voltage axis margin among the voltage axis margins of the feature points at the selection arrangement location as the voltage axis margin at the selection arrangement location.

Figure 27:
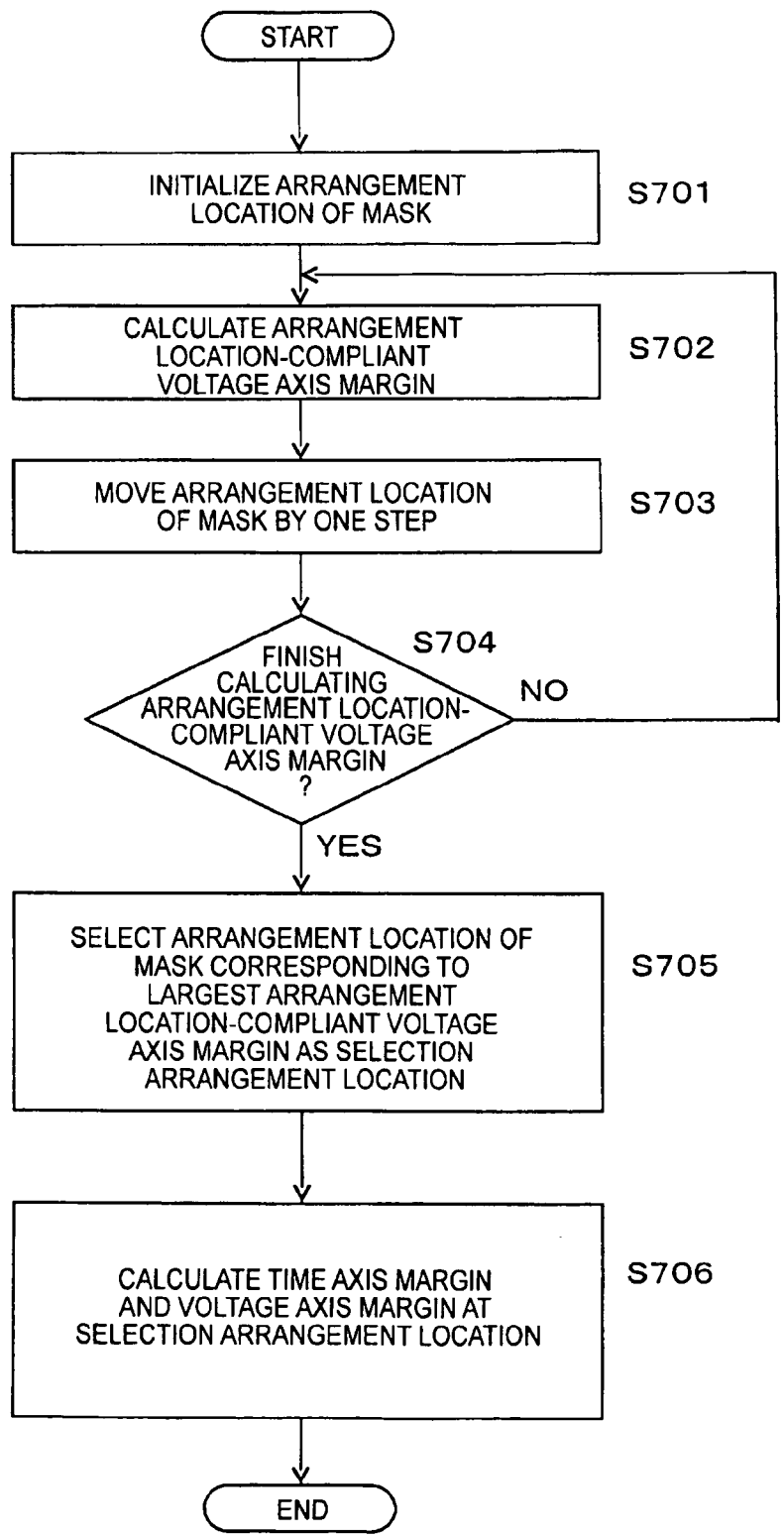
FIG. 27 is a diagram illustrating an example of a flow chart of a margin calculation processing.

FIG. 27 is a diagram illustrating an example of a flow chart of the margin calculation processing by the margin calculating unit when the third mode is set for the arrangement location of the mask. For example, when the arrangement location of the mask is such an arrangement location that the mask does not fall within the opening of the eye pattern, the margin calculating unit 220 does not execute a calculation processing of an arrangement location-compliant voltage axis margin in step S702 described below.

Figure 28:
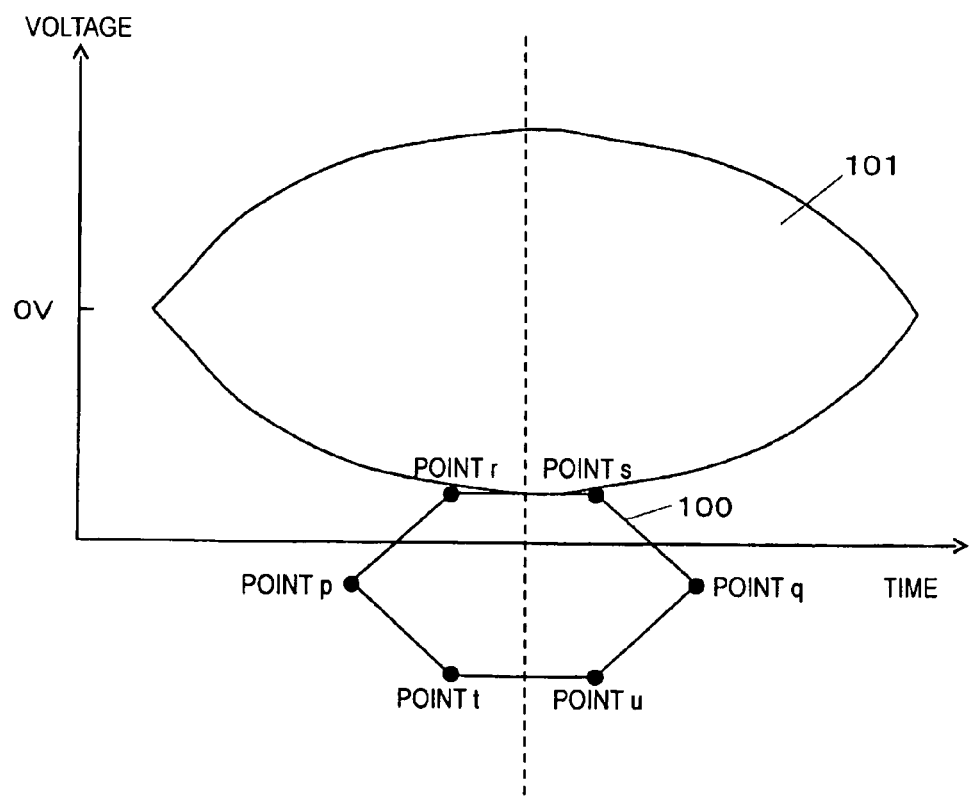
FIG. 28 is a diagram for explaining an example of initializing the arrangement location of the mask.

The margin calculating unit 220 first initializes the arrangement location of the mask (step S701). Specifically, as illustrated in FIG. 28, the margin calculating unit 220, for example, sets the center location in the time axis direction of the mask 100 to the center location of one cycle of the eye pattern (location in the time axis direction corresponding to a dotted line in FIG. 28). Further, the margin calculating unit 220 sets the arrangement location in the voltage axis direction of the mask 100 at the location where part of the mask 100 starts to enter the opening of the eye pattern. In the example, the mask 100 is moved upward in step S703 as described below with reference to FIG. 30.

The margin calculating unit 220 calculates the voltage axis margin corresponding to the current arrangement location of the mask (arrangement location-compliant voltage axis margin) (step S702). Specifically, the margin calculating unit 220 calculates the voltage axis margins of the feature points of the mask at the current arrangement location (differences between the voltage coordinate values of the feature points and the voltage coordinate values of the waveform signal piece parts associated with the feature points). Further, the margin calculating unit 220 sets the voltage axis margin of the feature point where the calculated voltage axis margin is the smallest as the arrangement location-compliant voltage axis margin.

Figure 29:
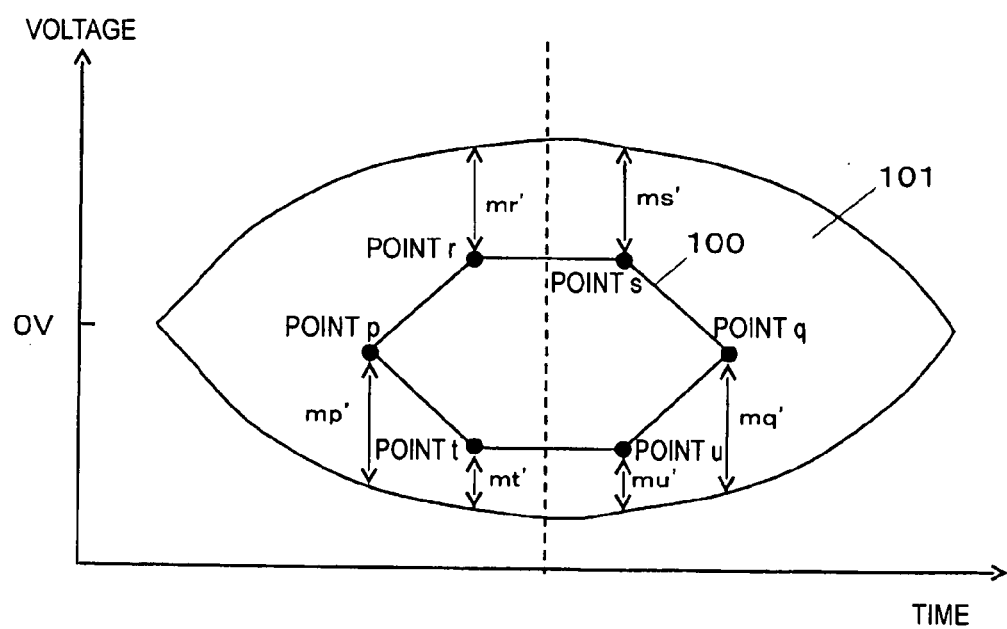
FIG. 29 is a diagram for explaining an example of calculating the arrangement location-compliant time axis margin.

For example, it is assumed that the current arrangement location of the mask is at the arrangement location as illustrated in FIG. 29. The margin calculating unit 220 calculates a voltage axis margin mr' of the point r, a voltage axis margin ms' of the point s, a voltage axis margin mp' of the point p, a voltage axis margin mq' of the point q, a voltage axis margin mt' of the point t, and a voltage axis margin mu' of the point u. The margin calculating unit 220, for example, executes a processing similar to the determination processing of the voltage axis margin of feature point described with reference to the flow chart illustrated in FIG. 7, in other words, calculates mr', ms', mt', and mu'. Furthermore, the margin calculating unit 220, for example, specifies, for the plot data of each cycle, the voltage coordinate value of the waveform signal piece part where the time coordinate value is closest to the time coordinate value of the point p to calculate the difference between the specified voltage coordinate value and the voltage coordinate value of the point p. And, the margin calculating unit 220 calculates the minimum value among the calculated differences as mp'. The margin calculating unit 220 calculates mq' using a method similar to the calculation method of mp'. Among the calculated mr', ms', mp', mt', and mu', the margin calculating unit 220 sets mt' with the smallest value as the voltage axis margin corresponding to the current arrangement location of the mask (arrangement location-compliant voltage axis margin).

The margin calculating unit 220 may calculate the voltage axis margins only for the feature points point r, point s, point t, and point u where the voltage axis coordinate is not at the center location in the voltage direction of the mask. And, the margin calculating unit 220 may set the voltage axis margin with the smallest value among the calculated voltage axis margins as the arrangement location-compliant voltage axis margin.

Figure 30:
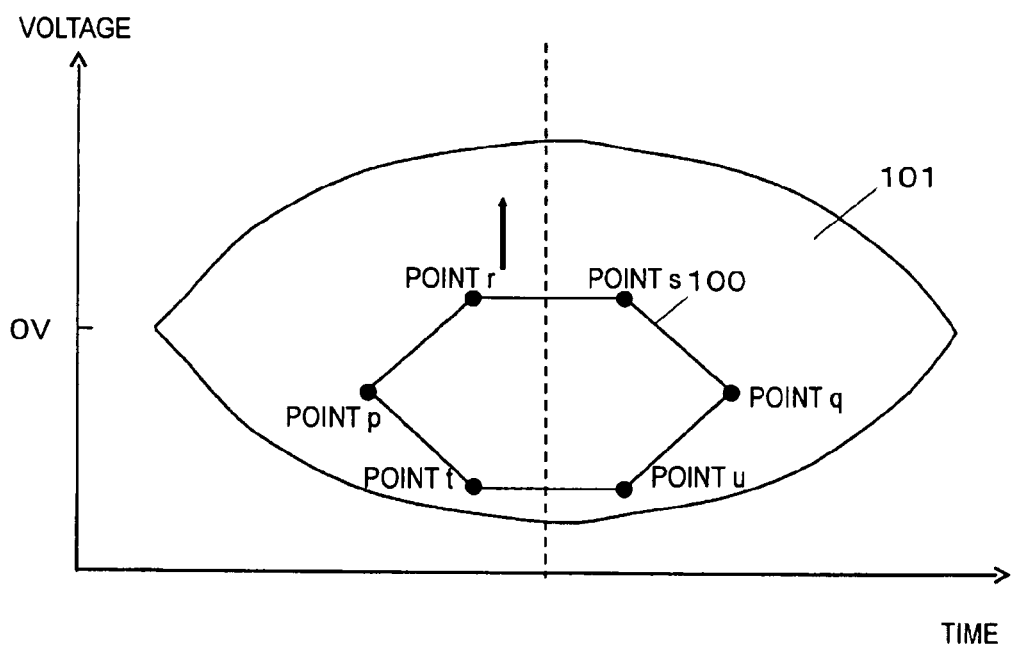
FIG. 30 is a diagram for explaining the movement of the arrangement location of the mask.

Next, the margin calculating unit 220 moves the arrangement location of the mask one step in the voltage axis direction (step S703). FIG. 30 is a diagram for explaining the movement of the arrangement location of the mask. While fixing the center location in the time axis direction of the mask

100 to the center location of one cycle of the eye pattern, the margin calculating unit 220 moves the mask 100 step by step along the route illustrated with a dotted line in FIG. 30 until the mask 100 starts to exit from the opening 101 of the eye pattern, for example, in the direction of the arrow illustrated in FIG. 30 (upward).

The margin calculating unit 220 determines whether to finish calculating the arrangement location-compliant voltage axis margin (step S704). Specifically, the margin calculating unit 220 determines whether the arrangement location of the mask is at the arrangement location where the mask 100 starts to exit from the opening 101 of the eye pattern. When the arrangement location of the mask is at the arrangement location where the mask 100 starts to exit from the opening 101 of the eye pattern, the margin calculating unit 220 determines to finish calculating the arrangement location-compliant voltage axis margin.

When the arrangement location of the mask is not at the arrangement location where the mask 100 starts to exit from the opening 101 of the eye pattern, the margin calculating unit 220 determines not to finish calculating the arrangement location-compliant voltage axis margin.

When the margin calculating unit 220 determines not to finish calculating the arrangement location-compliant time axis margin, the processing returns to step S702. When the margin calculating unit 220 determines to finish calculating the arrangement location-compliant time axis margin, the margin calculating unit 220 selects the arrangement location of the mask corresponding to the largest arrangement location-compliant voltage axis margin among the calculated arrangement location-compliant voltage axis margins as a selection arrangement location (step S705). The margin calculating unit 220 then calculates the time axis margin and the voltage axis margin at the selection arrangement location (step S706). The margin calculating unit 220 calculates the minimum time axis margin among the time axis margins of the feature points at the selection arrangement location as the time axis margin at the selection arrangement location. The margin calculating unit 220 also calculates the minimum voltage axis margin among the voltage axis margins of the feature points at the selection arrangement location as the voltage axis margin at the selection arrangement location.

Figure 31:
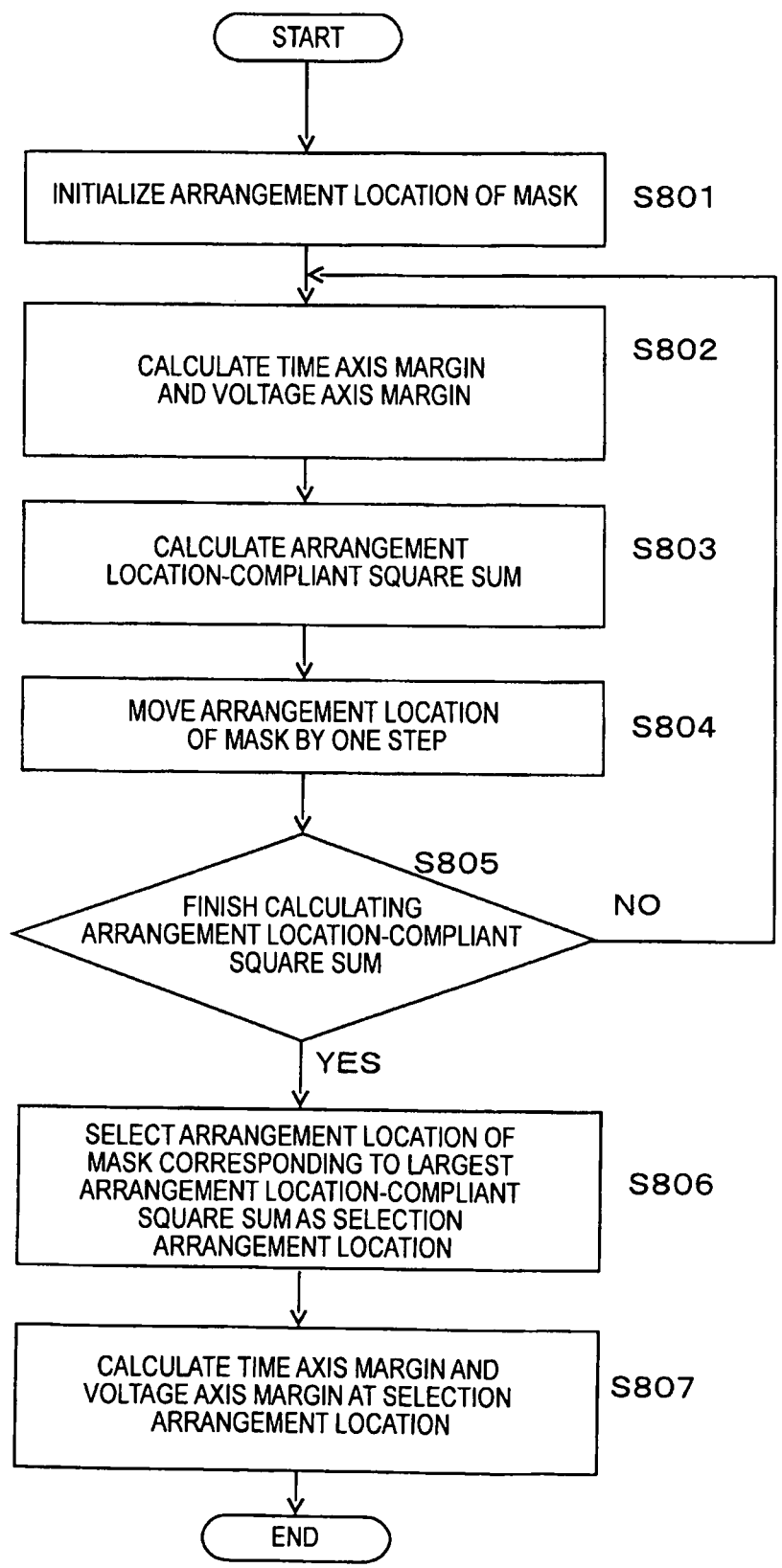
FIG. 31 is a diagram illustrating an example of a flow chart of the margin calculation processing.

FIG. 31 is a diagram illustrating an example of a flow chart of the margin calculation processing by the margin calculating unit when the fourth mode is set for the arrangement location of the mask. For example, when the arrangement location of the mask is such an arrangement location that the mask does not fall within the opening of the eye pattern, the margin calculating unit 220 does not execute a calculation processing of time axis margins and voltage axis margins in step S802 described below and a calculation processing of the arrangement location-compliant square sum in step S803.

Figure 32:
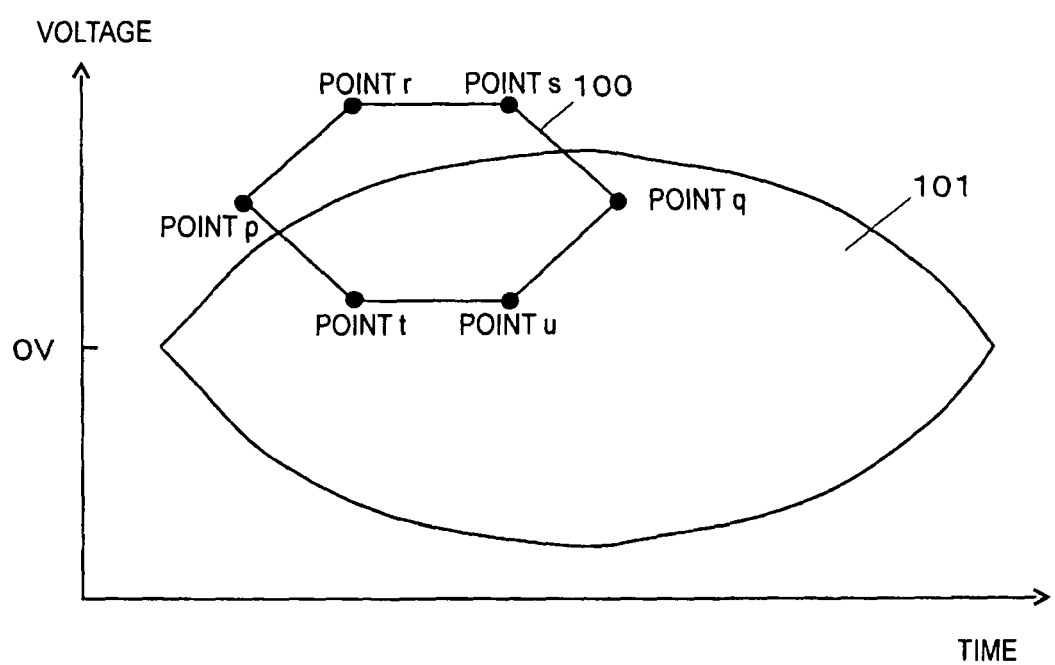
FIG. 32 is a diagram for explaining an example of initializing the arrangement location of the mask.

The margin calculating unit 220 first initializes the arrangement location of the mask (step S801). Specifically, as illustrated in FIG. 32, the margin calculating unit 220, for example, sets the center location in the voltage axis direction of the mask 100 and the center location in the time axis direction of the mask 100 to predetermined arbitrary arrangement locations.

Figure 33:
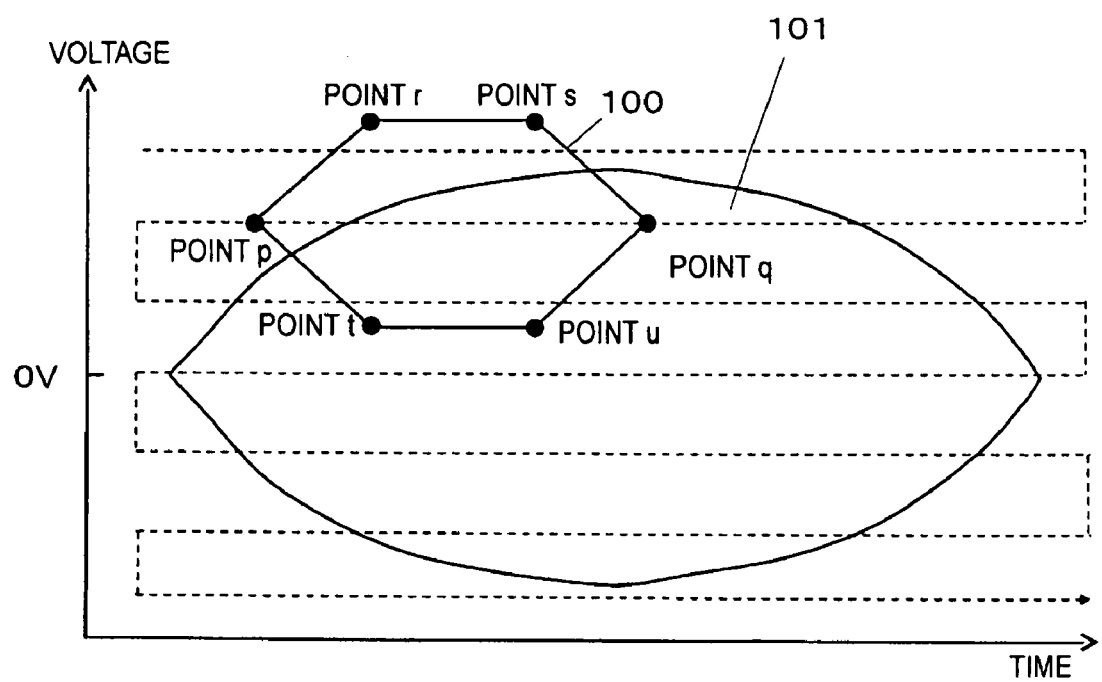
FIG. 33 is a diagram for explaining the movement of the arrangement location of the mask.

The margin calculating unit 220 calculates the time axis margins and the voltage axis margins of the feature points of the mask at the current arrangement location (step S802). The margin calculating unit 220 then calculates square sums of the calculated time axis margins and voltage axis margins, and calculates the square sum corresponding to the feature point in which the calculated square sum is the smallest as a square sum corresponding to the current arrangement location of the mask (arrangement location-compliant square sum) (step S803). Next, the margin calculating unit 220 moves the arrangement location of the mask by one step in the time axis direction or the voltage axis direction (step S804). FIG. 33 is a diagram for explaining the movement of the arrangement location of the mask. The margin calculating unit 220, for example, moves the mask 100 step by step along the route illustrated with a dotted arrow in FIG. 33 until the mask 100 passes through all areas of the opening 101 of the eye pattern.

The margin calculating unit 220 determines whether to finish calculating the arrangement location-compliant square sum (step S805). Specifically, the margin calculating unit 220 determines whether the mask has passed through all areas of the opening 101 of the eye pattern. When the margin calculating unit 220 determines that the mask 100 has passed through all areas of the opening 101 of the eye pattern, the margin calculating unit 220 determines to finish calculating the arrangement location-compliant square sum.

When the margin calculating unit 220 determines that there is an area of the opening 101 of the eye pattern that the mask 100 has not passed through, the margin calculating unit 220 determines not to finish calculating the arrangement location-compliant time square sum.

When the margin calculating unit 220 determines not to finish calculating the arrangement location-compliant square sum, the processing returns to step S802. When the margin calculating unit 220 determines to finish calculating the arrangement location-compliant square sum, the margin calculating unit 220 selects the arrangement location of the mask corresponding to the largest arrangement location-compliant square sum among the arrangement location-compliant square sums calculated in step S803 as a selection arrangement location (step S806). The margin calculating unit 220 then calculates the time axis margin and the voltage axis margin at the selection arrangement location (step S807). Specifically, the margin calculating unit 220 calculates the smallest time axis margin among the time axis margins of the feature points at the selection arrangement location as the time axis margin at the selection arrangement location. The margin calculating unit 220 also calculates the smallest voltage axis margin among the voltage axis margins of the feature points at the selection arrangement location as the voltage axis margin at the selection arrangement location.

The embodiments are used to obtain a margin included in an eye pattern generated by a simulator implemented in a product design phase of an electronic device relative to a mask as a quality evaluation criterion and realizes automatic calculation of an accurate margin included in the eye pattern relative to the mask.

All examples and conditional language recited herein are intended for pedagogical purpose to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the sprit and scope of the invention.

What is claimed is:

1. An eye margin calculating apparatus that calculates a margin between an eye pattern generated by superimposing waveform signal pieces with a specified length cut out from a waveform signal generated by a simulator and a mask indicating the size of an opening required for the eye pattern, the eye margin calculating apparatus comprising:

first calculating means for calculating a center location of the eye pattern;

second calculating means for calculating time coordinate values and voltage coordinate values of feature points included in the mask in a case that a center location of the mask is arranged at the center location of the eye pattern;

third calculating means for calculating a margin in a voltage axis direction based on voltage coordinate values of first feature points and voltage coordinate values of waveform signal piece parts associated with the first feature points, the first feature points being feature points not on a time axis among the feature points; and fourth calculating means for calculating a margin in a time axis direction based on time coordinate values of second feature points and time coordinate values of waveform signal piece parts associated with the second feature points, the second feature points being feature points on the time axis among the feature points.

2. The eye margin calculating apparatus according to claim 1, wherein the first calculating means extracts waveform signal parts near the time axis included in the waveform signal pieces, detects minimum times and maximum times included in time coordinate values of the extracted waveform signal parts, and calculates the center location of the eye pattern based on the detected minimum times and maximum times.

3. The eye margin calculating apparatus according to claim 1, wherein the third calculating means uses voltage coordinate values of the waveform signal piece parts, each of which has a time coordinate value closest to each of the first feature points, as the voltage coordinate values of the waveform signal piece parts associated with the first feature points.

4. The eye margin calculating apparatus according to claim 1, wherein the third calculating means uses voltage coordinate values, each of which is obtained by linearly interpolating two waveform signal piece parts that sandwich and are adjacent to each of the first feature points, as the voltage coordinate values of the waveform signal piece parts associated with the first feature points.

5. The eye margin calculating apparatus according to claim 1, wherein the fourth calculating means uses time coordinate values of the waveform signal piece parts, each of which has a voltage coordinate value near the time axis and is closest to the time axis, as the time coordinate values of the waveform signal piece parts associated with the second feature points.

6. The eye margin calculating apparatus according to claim 1, wherein the fourth calculating means uses coordinate values on the time axis, each of which is obtained by linearly interpolating two waveform signal piece parts that sandwich and are adjacent to the time axis, as the time coordinate values of the waveform signal piece parts associated with the second feature points.

7. The eye margin calculating apparatus according to claim 1, wherein the third calculating means calculates a difference between the voltage coordinate values of the first feature points and the voltage coordinate values of the waveform signal piece parts associated with the first feature points for each of the waveform signal pieces, specifies a smallest difference value among the difference values to calculate margins in the voltage axis direction of each of the first feature points, and selects a smallest margin among the margins as a final margin in the voltage axis direction.

8. The eye margin calculating apparatus according to claim 1, wherein the fourth calculating means calculates a difference between the time coordinate values of the second feature points and the time coordinate values of the waveform signal piece parts associated with the second feature points for each of the waveform signal pieces, specifies a smallest difference value among the difference values to calculate margins in the time axis direction of each of the second feature points, and selects a smallest margin among the margins as a final margin in the time axis direction.

9. An eye margin calculation method for calculating a margin between an eye pattern generated by superimposing waveform signal pieces with a specified length cut out from a waveform signal generated by a simulator and a mask indicating the size of an opening required for the eye pattern, the eye margin calculation method comprising:

calculating a center location of the eye pattern;

calculating time coordinate values and voltage coordinate values of feature points included in the mask in a case that a center location of the mask is arranged at the center location of the eye pattern;

calculating a margin in a voltage axis direction based on voltage coordinate values of first feature points and voltage coordinate values of waveform signal piece parts associated with the first feature points, the first feature points being feature points not on a time axis among the feature points; and calculating a margin in a time axis direction based on time coordinate values of second feature points and time coordinate values of a waveform signal piece parts associated with the second feature points, the second feature points being feature points on the time axis among the feature points.

10. A non-transitory computer-readable recording medium recording an eye margin calculation program for realizing an eye margin calculating apparatus that calculates a margin between an eye pattern generated by superimposing waveform signal pieces with a specified length cut out from a waveform signal generated by a simulator and a mask indicating the size of an opening required for the eye pattern, the eye margin calculation program causing a computer to execute the operations of:

calculating a center location of the eye pattern;

calculating time coordinate values and voltage coordinate values of feature points included in the mask in a case that a center location of the mask is arranged at the center location of the eye pattern;

calculating a margin in a voltage axis direction based on voltage coordinate values of first feature points and voltage coordinate values of waveform signal piece parts associated with the first feature points, the first feature points being feature points not on a time axis among the feature points; and calculating a margin in a time axis direction based on time coordinate values of second feature points and time coordinate values of a waveform signal piece parts associated with the second feature points, the second feature points being feature points on the time axis among the feature points.

* * * * *

UNITED STATES PATENT AND TRADEMARK OFFICE
CERTIFICATE OF CORRECTION

PATENT NO. : 8,243,995 B2
APPLICATION NO. : 12/591843
DATED : August 14, 2012
INVENTOR(S) : Daita Tsubamoto et al.

It is certified that error appears in the above-identified patent and that said Letters Patent is hereby corrected as shown below:

On the Title Page, Item (54) and in the specification, Column 1, Line 5, Title, Delete "THEREFOF" and insert -- THEREOF --, therefor.

Signed and Sealed this
Ninth Day of April, 2013

Teresa Stanek Rea
*Acting Director of the United States Patent and Trademark Office*